United States Patent
Sumida

(10) Patent No.: US 10,964,831 B2
(45) Date of Patent: Mar. 30, 2021

(54) SOLAR CELL MODULE AND METHOD OF MANUFACTURING SOLAR CELL MODULE

(71) Applicant: KYOCERA CORPORATION, Kyoto (JP)

(72) Inventor: Kenichirou Sumida, Omihachiman (JP)

(73) Assignee: KYOCERA CORPORATION, Kyoto (JP)

(*) Notice: Subject to any disclaimer, the term of this patent is extended or adjusted under 35 U.S.C. 154(b) by 0 days.

(21) Appl. No.: 16/546,020

(22) Filed: Aug. 20, 2019

(65) Prior Publication Data

US 2019/0371951 A1 Dec. 5, 2019

Related U.S. Application Data

(63) Continuation of application No. PCT/JP2018/006128, filed on Feb. 21, 2018.

(51) Int. Cl.
| | |
|---|---|
| H01L 31/049 | (2014.01) |
| H01L 21/66 | (2006.01) |
| H02S 40/34 | (2014.01) |
| H01L 31/02 | (2006.01) |
| H01L 31/18 | (2006.01) |

(52) U.S. Cl.
CPC ............ *H01L 31/049* (2014.12); *H01L 22/22* (2013.01); *H01L 31/02013* (2013.01); *H01L 31/1876* (2013.01); *H02S 40/34* (2014.12)

(58) Field of Classification Search
None
See application file for complete search history.

(56) References Cited

U.S. PATENT DOCUMENTS

| | | |
|---|---|---|
| 2004/0003840 A1 | 1/2004 | Umemoto |
| 2009/0014060 A1 | 1/2009 | Nakatani et al. |
| 2013/0333754 A1* | 12/2013 | Itou ................... H01L 31/0481 136/256 |
| 2016/0308081 A1 | 10/2016 | Ishiguro et al. |

FOREIGN PATENT DOCUMENTS

| | | |
|---|---|---|
| JP | 2004-014791 A | 1/2004 |
| JP | 2008-270743 A | 11/2008 |
| JP | 2009-021288 A | 1/2009 |
| JP | 2010-034500 A | 2/2010 |
| WO | 2015/056399 A1 | 4/2015 |

* cited by examiner

*Primary Examiner* — Asok K Sarkar
(74) *Attorney, Agent, or Firm* — Duane Morris LLP

(57) ABSTRACT

A solar cell module comprises a plate-like first protector having translucency, a second protector, a solar cell element, first to third sealers, and first and second wiring members. The solar cell element is located between the first protector and the second protector. The first sealer covers the solar cell element from a side of the first protector between the first protector and the solar cell element. The second sealer covers the solar cell element from a side of the second protector between the solar cell element and the second protector. The third sealer covers the second sealer from a side of the second protector between the second sealer and the second protector. The first wiring member is electrically connected to the solar cell element and passes through the second sealer. The second wiring member is connected to the first wiring member between the second sealer and the second protector.

9 Claims, 12 Drawing Sheets

SOLAR CELL MODULE AND METHOD OF MANUFACTURING SOLAR CELL MODULE

CROSS-REFERENCE TO RELATED APPLICATIONS

The present application is a continuation based on PCT Application No. PCT/JP2018/006128 filed on Feb. 21, 2018, which claims the benefit of Japanese Application No. 2017-033458, filed on Feb. 24, 2017. PCT Application No. PCT/JP2018/006128 is entitled "SOLAR CELL MODULE AND METHOD FOR MANUFACTURING SOLAR CELL MODULE", and Japanese Application No. 2017-033458 is entitled "SOLAR CELL MODULE AND METHOD FOR MANUFACTURING SOLAR CELL MODULE". The contents of which are incorporated by reference herein in their entirety.

FIELD

Embodiments of the present disclosure relate generally to a solar cell module and a method of manufacturing the solar cell module.

BACKGROUND

Recently introduced is a feed-in tariff system in a renewable energy designed to promote a spread of a solar cell module, for example. In this system, a purchase period (also referred to as a procurement period) is set to ten years to twenty years. Expected accordingly is that used solar cell modules in which the procurement period has been completed are generated in large numbers in the future.

In the meanwhile, a durable life of the solar cell module is supposed to be twenty years to thirty years or so, for example. Thus, the used solar cell modules include a considerable number of solar cell modules which can still generate electrical power sufficiently. Accordingly, a reuse of the solar cell module is considered in terms of reducing an amount of disposal of the solar cell module and an effective use of resources, for example.

However, with regard to the solar cell module which does not sufficiently have a usable period after reuse, for example, there is a possibility that a power generation amount after a relocation of the solar cell module does not meet a cost required for a relocation work of the solar cell module. Herein, the usable period after reuse corresponds to a period after the completion of the procurement period until the durable life elapses.

Proposed accordingly is a technique of performing processing for prolonging the usable period on the solar cell module at the time of reusing the solar cell module.

SUMMARY

A solar cell module and a method of manufacturing a solar cell module are disclosed.

In one embodiment, a solar cell module comprises a plate-like first protection member, a second protection member, at least one solar cell element, a first sealing member, a second sealing member, a third sealing member, a plurality of first wiring members, and a plurality of second wiring members. The first protection member has translucency. The at least one solar cell element is located between the first protection member and the second protection member. The first sealing member is located to cover the at least one solar cell element from a side of the first protection member between the first protection member and the at least one solar cell element. The second sealing member is located to cover the at least one solar cell element from a side of the second protection member between the at least one solar cell element and the second protection member. The third sealing member is located to cover the second sealing member from a side of the second protection member between the second sealing member and the second protection member. The plurality of first wiring members are located to be electrically connected to the at least one solar cell element and pass through the second sealing member. The plurality of second wiring members are located to be connected to the plurality of first wiring members between the second sealing member and the second protection member.

In one embodiment, a method of manufacturing a solar cell module comprises a step of preparing a solar cell module before repaired, a step of taking out a terminal box, a step of cutting off a plurality of first wiring members, a step of peeling off a protection sheet, a step of connecting a plurality of second wiring members, a placement step, and an integration step. The solar cell module before repaired comprises a plate-like first protection member, the protection sheet, at least one solar cell element, a first sealing member, a second sealing member, a plurality of first wiring members, and the terminal box. The first protection member has translucency. The at least, one solar cell element is located between the first protection member and the protection sheet. The first sealing member is located to cover the at least one solar cell element from a side of the first protection member between the first protection member and the at least one solar cell element. The second sealing member is located to cover the at least one solar cell element from a side of the protection sheet between the at least one solar cell element and the protection sheet. The plurality of first wiring members are located to be electrically connected to the at least one solar cell element and pass through the second sealing member and the protection sheet. The terminal box is located on the protection sheet, and includes a terminal to which the plurality of first wiring members are connected. The step of taking out the terminal box includes a step of taking out the terminal box from the protection sheet. The step of cutting off the plurality of first wiring members includes a step of cutting off a part of the plurality of first wiring members ranging from the protection sheet to the terminal. The step of peeling off the protection sheet includes a step of peeling off the protection sheet from the second sealing member. The step of connecting the plurality of second wiring members includes a step of connecting the plurality of second wiring members to parts of the plurality of first wiring members protruding from the second sealing member. The placement step includes a step of placing at least one sheet which is to be a third sealing member and a second protection member to be stacked on the second sealing member. The integration step includes a step of heating the at least one sheet to integrate the second sealing member, the third sealing member, and the second protection member.

DETAILED DESCRIPTION

Figure 1:
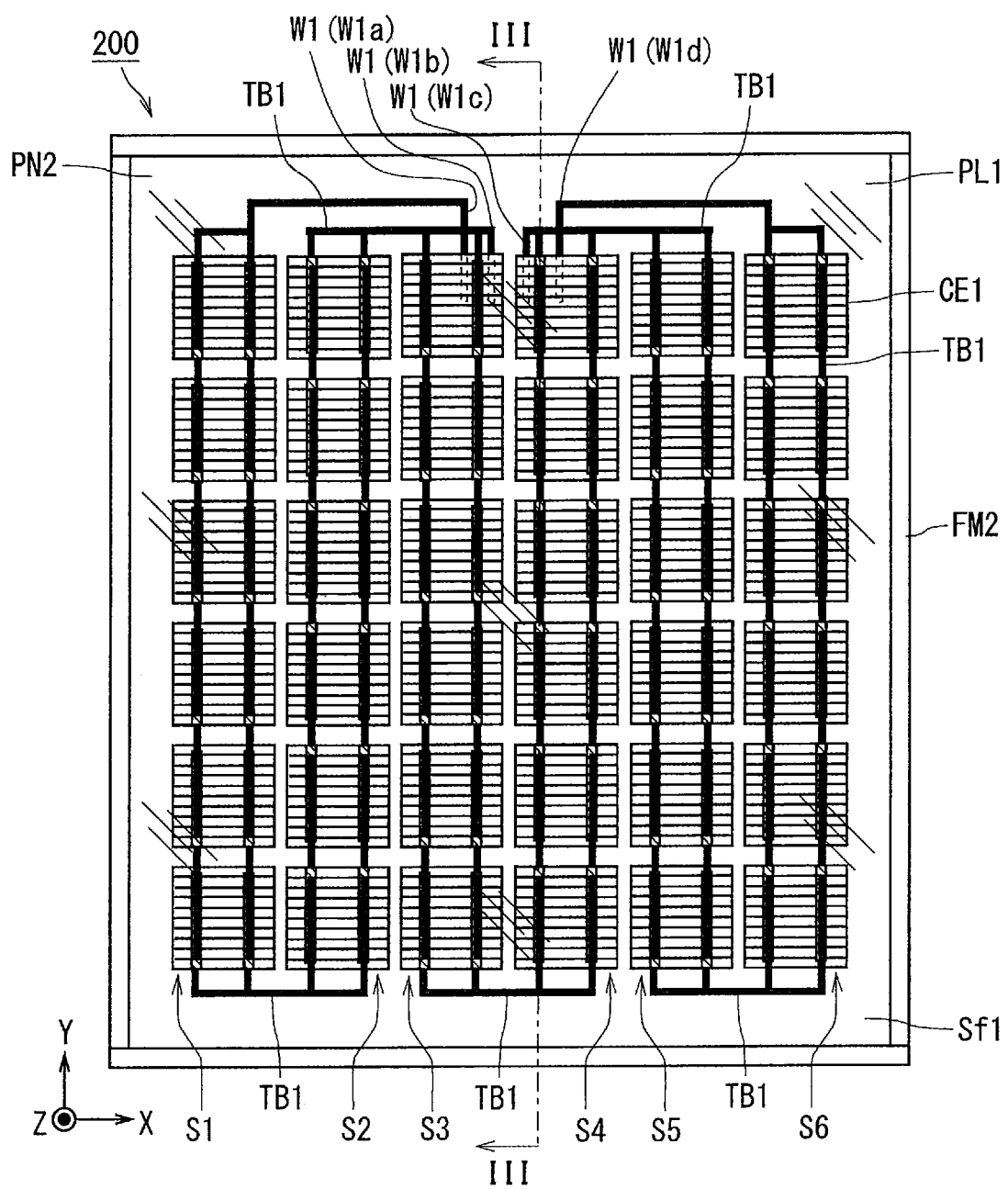
FIG. 1 illustrates a plan view showing one example of an external appearance of a solar cell module according to a first embodiment.

A used solar cell module is considered to be reused in terms of reducing an amount of disposal of the solar cell module and an effective use of resources.

A solar cell module generally has a structure that a transparent glass substrate, a front surface side sealing member, a plurality of solar cell elements, a back surface side sealing member, and a protection sheet are stacked in layers in this order from a side of a light receiving surface. In such a solar cell module, for example, one main factor for a deterioration of the solar cell module is that moisture easily enters the solar cell element from the protection sheet made of resin in accordance with the deterioration of the protection sheet.

Thus, it is considered that, for example, the protection sheet of the solar cell module is re-covered to improve durability on a back surface side of the solar cell module, so that a usable period of the solar cell module is prolonged.

However, when complicated processing is necessary to perform processing for improving the durability on the back surface side of the solar cell module, there is a possibility that a benefit of using a reused item cannot be obtained sufficiently compared with a new item.

Thus, there is room for improvement of easily prolonging the usable period in the solar cell module.

Accordingly, the present inventor has created a technique capable of easily prolonging the usable period in the solar cell module.

In this regard, each embodiment will be described with reference to the drawings. In the drawings, components having similar configuration and function are denoted by the same reference symbols, and overlapping description will be omitted in the description below. The drawings are schematically illustrated, and therefore some of constituent elements are omitted in some cases. An XYZ coordinate system of a right-handed system is depicted in FIG. 1 to FIG. 7 and FIG. 9A to FIG. 15E. In this XYZ coordinate system, a longitudinal direction in a front surface Sf1 of a solar cell module 200 after repaired described hereinafter is indicated by a +Y direction, a short-side direction in the front surface Sf1 is indicated by a +X direction, and a direction perpendicular to both the +X direction and the +Y direction is indicated by a +Z direction.

1. First Embodiment

<1-1. Configuration of Solar Cell Module>

The solar cell module 200 according to a first embodiment will be described with reference to FIG. 1 to FIG. 6. The solar cell module 200 is a solar cell module (also referred to as a second solar cell module) after repaired which can be manufactured by replacing a configuration of a back surface side of a solar cell module (also referred to as a first solar cell module) 100 before repaired which has been used, for example (refer to FIG. 7 and FIG. 10). The solar cell module after repaired, which is repaired and regenerated, contributes to a reuse of a solar cell module.

Figure 2:
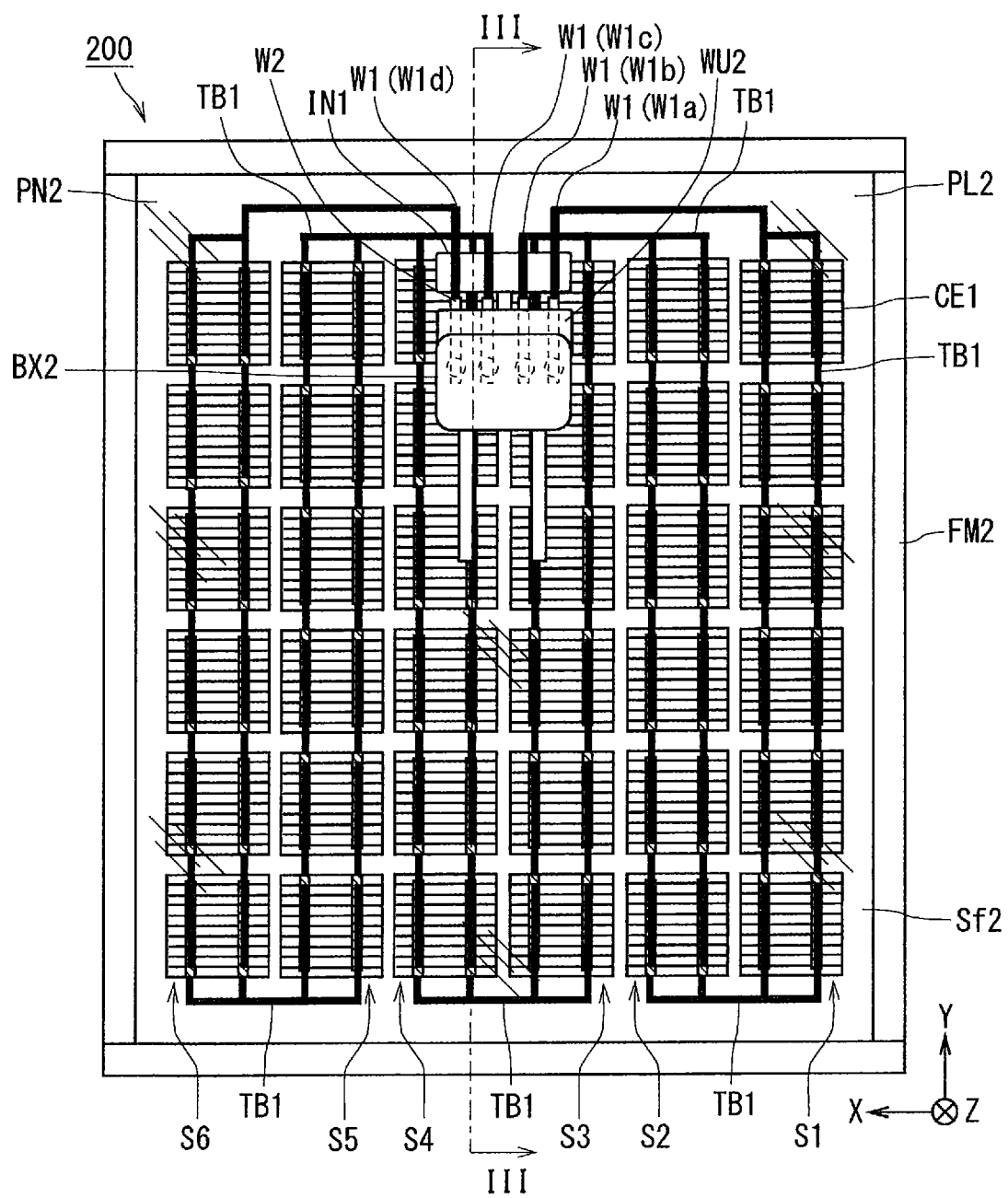
FIG. 2 illustrates a rear view showing one example of an external appearance of the solar cell module according to the first embodiment.

As shown in FIG. 1 and FIG. 2, the second solar cell module 200 comprises, for example, a solar cell panel (also referred to as a second solar cell panel) PN2, a frame (also referred to as a second frame) FM2, and a terminal box (also referred to as a second terminal box) BX2.

As shown in FIG. 1 to FIG. 4, the second solar cell panel PN2 comprises a first protection member PL1, a first sealing member FL1, N (N is a natural number) solar cell elements CE1, a second sealing member FL2, a third sealing member FL3, a second protection member PL2, a plurality of first wiring members W1, and a plurality of second wiring members W2. Herein, the first protection member PL1 and the second protection member PL2 are located to face with each other. The first sealing member FL1, the N solar cell elements CE1, the second sealing member FL2, the third sealing member FL3, the plurality of first wiring members W1, and the plurality of second wiring members W2 are located between the first protection member PL1 and the second protection member PL2. However, parts of the plurality of second wiring members W2 are located in a state of being drawn out of the second solar cell panel PN2 through a through hole TH1 which is previously provided in the second protection member PL2. In the examples in FIG. 1 to FIG. 4, the first protection member PL1, the first sealing member FL1, the N solar cell elements CE1, the second sealing member FL2, the third sealing member FL3, and the second protection member PL2 are located to be stacked in this order described above.

In the example in FIG. 1 to FIG. 4, a surface of the first protection member PL1 in the +Z direction is located to be the surface (also referred to as the front surface) Sf1 irradiated by outside light such as solar light mainly. A surface of the second protection member PL2 facing in a −Z direction is located to be the surface (also referred to as the back surface) Sf2 which is less irradiated by the outside light such as the solar light than the front surface Sf1. In the example in FIG. 2 to FIG. 4, the terminal box (also referred to as the second terminal box) BX2 is located on the back surface Sf2. For example, the second terminal box BX2 may be fixed to the back surface Sf2 by an adhesive agent AT2 such as a silicone-based resin. The second terminal box BX2 can output electricity obtained by a power generation in the N solar cell elements CE1 to an outside of the second solar cell module 200 via a cable CB2, for example. A second frame FM2 is attached to an outer periphery EG2 connecting the front surface Sf1 and the back surface Sf2 of the second solar cell panel PN2 along the outer periphery EG2. Herein, for example, the outer periphery EG2 of the second solar cell panel PN2 is located to be fitted in a groove of the second frame FM2. Herein, the outer periphery EG2 of the second solar cell panel PN2 is located to be fixed to the second frame FM2 by an adhesive agent such as a butyl-based resin, for example, in the groove of the second frame FM2.

The first protection member PL1 is a plate-like member having translucency. The first protection member PL1 has translucency with respect to light having a wavelength in a specific range, for example. Adopted as the wavelength in the specific range is a wavelength of light on which one or more solar cell elements CE1 can perform a photoelectric conversion, for example. If glass or a resin such as acrylic or polycarbonate, for example, is adopted as a material of the first protection member PL1, a water shielding property and the translucency with respect to the light having the wavelength in the specific range are achieved. Adopted as the first protection member PL1 is a member having a flat-plate shape with a thickness of 1 mm to 5 mm in which both the front surface and the back surface have a rectangular shape, for example. The first protection member PL1 having the configuration described above can protect the N solar cell elements CE1 from a side of the front surface Sf1 by stiffness and a water shielding property, for example.

The first sealing member FL1 is located to cover the N solar cell elements CE1 from a side of the first protection member PL1 between the first protection member PL1 and the N solar cell elements CE1, for example. In the example in FIG. 3 and FIG. 4, the first sealing member FL1 is located to fill a region between the first protection member PL1 and the N solar cell elements CE1 while covering the solar cell element CE1. Adopted as the material of the first sealing member FL1 is, for example, ethylene-vinyl acetate copolymer (EVA), triacetylcellulose (TAC) or a polyester resin such as polyethylene naphthalate (PEN) excellent at the translucency with respect to the light having the wavelength in the specific range.

The N solar cell elements CE1 are located between the first protection member PL1 and the second protection member PL2, for example. The solar cell element CE1 can convert the incoming solar light into electricity, for example. For example, a crystal type solar cell element or a thin film solar cell element may be adopted as the solar cell element CE1. In the example in FIG. 1 to FIG. 4, a crystal silicon type solar cell element is adopted as the solar cell element CE1. The thirty-six solar cell elements CE1 are located to be electrically connected in series by a connection conductor TB1. More particularly, the N solar cell elements CE1 constitute six solar cell element groups S1, S2, S3, S4, S5, and S6. In each of the solar cell element groups S1, S2, S3, S4, S5, and S6, the six solar cell elements CE1 arranged along the +Y direction are located to be electrically connected in series by the connection conductor TB1. The six solar cell element groups S1, S2, S3, S4, S5, and S6 arranged in the +X direction are located to be electrically connected in series by the connection conductor TB1. Herein, the N solar cell elements CE1 may be one or more solar cell elements CE1, for example.

The second sealing member FL2 is located to cover the N solar cell elements CE1 from a side of the second protection member PL2 between the N solar cell elements CE1 and the second protection member PL2, for example. EVA, TAC, or a polyester resin such as PEN, for example, is adopted as a material of the second sealing member FL2 in the manner similar to the first sealing member FL1. Herein, the second sealing member FL2 may have translucency with respect to light having the wavelength in the specific range or may not have translucency with respect to light having the wavelength in the specific range.

The third sealing member FL3 is located to cover the second sealing member FL2 from the side of the second protection member PL2 between the second sealing member FL2 and the second protection member PL2, for example. EVA, TAC, or a polyester resin such as PEN, for example, is adopted as a material of the third sealing member FL3 in the manner similar to the second sealing member FL2. Herein, the third sealing member FL3 may have translucency with respect to light having the wavelength in the specific range or may not have translucency with respect to light having the wavelength in the specific range in the manner similar to the second sealing member FL2.

Herein, the solar cell element CE1 is located to be sealed and protected by the second sealing member FL2 from the side of the second protection member PL2. Thus, the third sealing member FL3 needs to have a thickness for tightly bonding the second protection member PL2 and the second sealing member FL2 in between. Thus, an average thickness in the whole third sealing member FL3 may be smaller than that in the whole second sealing member FL2. Accordingly, a used amount of the third sealing member FL3 can be reduced. A measurement method conforming to K7130 of Japanese Industrial Standards (JIS), for example, can be used for measuring the average thickness.

The second protection member PL2 is a member constituting the back surface Sf2 of the second solar cell panel PN2, for example. Thus, the second protection member PL2 can protect one or more solar cell elements CE1 from the side of the back surface Sf2. Herein, when the second protection member PL2 is a plate member having the water shielding property, the durability of the second solar cell module 200 can be improved. Accordingly, the usable period of the second solar cell module 200 can be easily prolonged, for example. If glass or a resin such as acrylic or polycarbonate, for example, is adopted as a material of the second protection member PL2, the second protection member PL2 having the water shielding property is achieved. At this time, for example, the second protection member PL2 has translucency with respect to light having the wavelength in the specific range and high stiffness. Accordingly, for example, the second protection member PL2 can sufficiently protect the N solar cell elements CE1 from the side of the back surface Sf2. Adopted as the second protection member PL2 is a member having a flat-plate shape with a thickness of 1 mm to 5 mm in which both the front surface and the back surface have a rectangular shape. Herein, in the example in FIG. 2 to FIG. 4, the second protection member PL2 has translucency with respect to light having the wavelength in the specific range. However, the second protection member PL2 may not have translucency with respect to light having the wavelength in the specific range, for example.

The plurality of first wiring members W1 are located to be electrically connected to the N solar cell elements CE1, for example. The plurality of first wiring members W1 are located to pass through the second sealing member FL2, for example. A material excellent at conductivity such as copper is adopted as a material of the first wiring member W1, for example. Specifically, a copper foil is adopted as the first wiring member W1, for example. When a copper foil covered by a solder is adopted as the first wiring member W1, for example, the soldering of the first wiring member W1 is easily performed. In the example in FIG. 1 and FIG. 2, the first wiring member W1 is located to be electrically connected to each of the solar cell element groups S1, S2, S3, S4, S5, and S6. Specifically, a primary first wiring member W1$a$ is located to be electrically-connected to the solar cell element group S1 via the connection conductor TB1. A secondary first wiring member W1$b$ is located to be electrically connected to the solar cell element groups S2 and S3 via the connection conductor TB1. A tertiary first wiring member W1$c$ is located to be electrically connected to the solar cell element groups S4 and S5 via the connection conductor TB1. A quaternary first wiring member W1$d$ is located to be electrically connected to the solar cell element group S6 via the connection conductor TB1. Furthermore, in the example in FIG. 3 and FIG. 4, one end of each first wiring member W1 is located in the third sealing member FL3.

The plurality of second wiring members W2 are located to be connected to the plurality of first wiring members W1 between the second sealing member FL2 and the second protection member PL2. The second wiring member W2 is located to be connected to the first wiring member W1 by a bonding performed by soldering, for example. The plurality of second wiring members W2 are located to electrically connecting the N solar cell elements CE1 to a terminal in the second terminal box BX2 via the plurality of first wiring member W1, for example. A material excellent at conductivity such as copper is adopted as a material of the second wiring member W2, for example, in the manner similar to the first wiring member W1. Specifically, a copper foil is adopted as the second wiring member W2, for example. When a copper foil covered by a solder is adopted as the second wiring member W2, for example, the soldering of the second wiring member W2 is easily performed.

In the example in FIG. 3 and FIG. 4, the plurality of second wiring members W2 are located to be connected to the plurality of first wiring members W1 between the second sealing member FL2 (or a fourth sealing member FL4 described hereinafter) and the third sealing member FL3. In the example in FIG. 3 to FIG. 6, a primary second wiring member W2$a$ is located to be connected to the primary first wiring member W1$a$. A secondary second wiring member W2$b$ is located to be connected to the secondary first wiring member W1$b$. A tertiary second wiring member W2$c$ is located to be connected to the tertiary first wiring member W1$c$. A quaternary second wiring member W2$d$ is located to be connected to the quaternary first wiring member W1$d$. In the example in FIG. 3 and FIG. 4, the plurality of second wiring members W2 are located to pass through the third sealing member FL3 and the second protection member PL2. Specifically, the second wiring member W2 is located to extend to an inner side of the second terminal box BX2 located on the back surface Sf2 via the through hole TH1 of the second protection member PL2. For example, when the four second wiring members W2 are located to pass through the different through holes TH1, respectively, a short circuit caused by a contact between the second wiring members W2 hardly occurs. Herein, each through hole TH1 which the second wiring member W2 is inserted and passes through is located to be sealed by a sealing member such as a butyl-based resin, a silicone-based resin, or a polyisopropylene-based resin, for example.

When the second solar cell module 200 having the above configuration is adopted, as indicated by a method of manufacturing the second solar cell module 200 described hereinafter, for example, it is possible to exchange the configuration on the side of the back surface of the first solar cell module 100 before repaired to easily manufacture the second solar cell module 200 after repaired.

Figure 7:
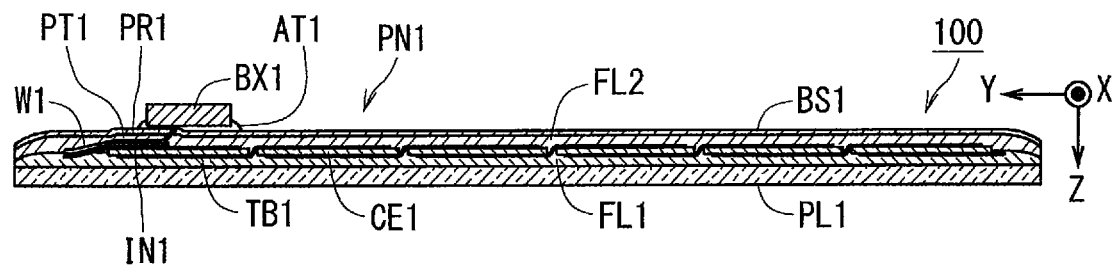
FIG. 7 illustrates a drawing showing a virtual cut section, in the solar cell module before repaired, corresponding to a virtual cut section of the solar cell module after repaired shown in FIG. 3.

Assumed herein is a case where the first solar cell module 100 before repaired has a super straight structure as shown in FIG. 7, for example. In this case, the first wiring member W1 drawn into the terminal box (also referred to as the first terminal box) BX1 before repaired on the back surface is located to be embedded in a filling material such as silicone filled in the first terminal box BX1. Thus, when the first solar cell module 100 is repaired, for example, it is necessary to perform an operation to dig out the first wiring member W1 from the filling material in the first terminal box BX1, for example, before peeling off the protection sheet SB1 as the protection member located on the side of the back surface of the first solar cell module 100, for example. Furthermore, a large number of working man-hours is necessary to perform this operation.

In contrast, the second solar cell module 200 after repaired can be easily manufactured from the first solar cell module 100 before repaired as described below, for example. Firstly, the first wiring member W1 is cut off in a position between the first terminal box BX1 and the protection sheet BS1 at the time of taking out the first terminal box BX1 from the first solar cell module 100 before repaired, for example. Next, the protection sheet BS1 is peeled off in the first solar cell module 100, for example. Next, the second wiring member W2 is additionally connected to the first wiring member W1, for example. Next, a sheet which is to be the third sealing member FL3 by an application of heat and the second protection member PL2 are stacked in layers on the second sealing member FL2, for example. Then, the third sealing member FL3 and the second protection member PL2 are integrated with the second sealing member FL2 by lamination processing, for example. Accordingly, the second wiring member W2 can be easily drawn into the second terminal box BX2 which is newly attached to the back surface Sf2 of the second solar cell module 200 after repaired, for example. When the second solar cell module 200 can be manufactured in this manner, for example, the number of working man-hours of digging out the first wiring member W1 from the filling material in the first terminal box BX1 can be reduced. As a result, the usable period of the second solar cell module 200 can be easily prolonged, for example.

Figure 3:
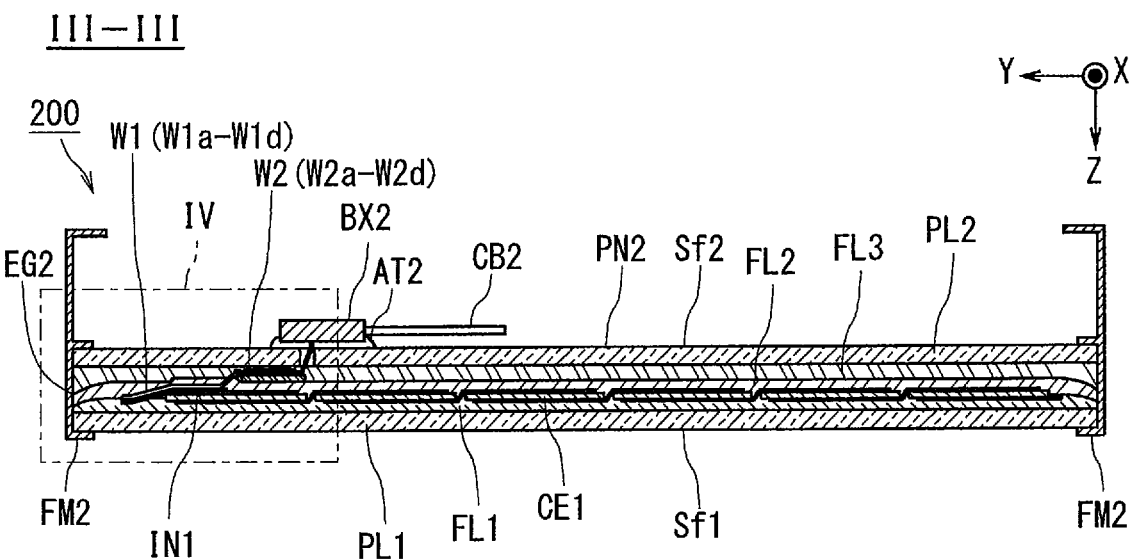
FIG. 3 illustrates a drawing showing a virtual cut section of the solar cell module along a line in FIG. 1 and FIG. 2.
Figure 4:
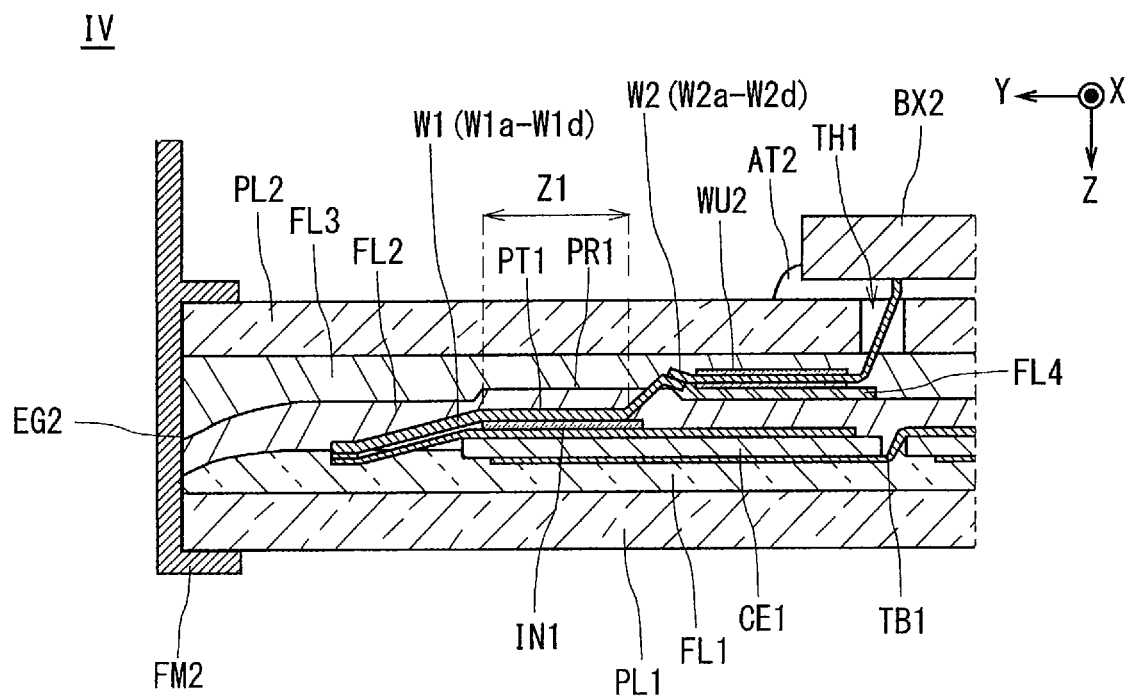
FIG. 4 illustrates a drawing showing a part of a virtual cut section of the solar cell module in a IV part in FIG. 3.
Figure 5:
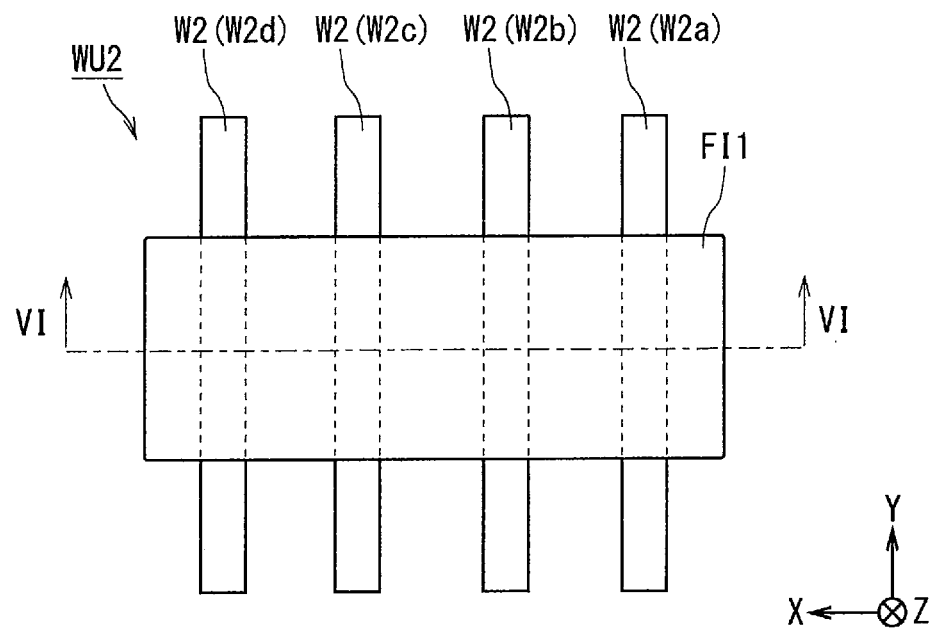
FIG. 5 illustrates a plan view showing one example of a configuration of a wiring unit.
Figure 6:
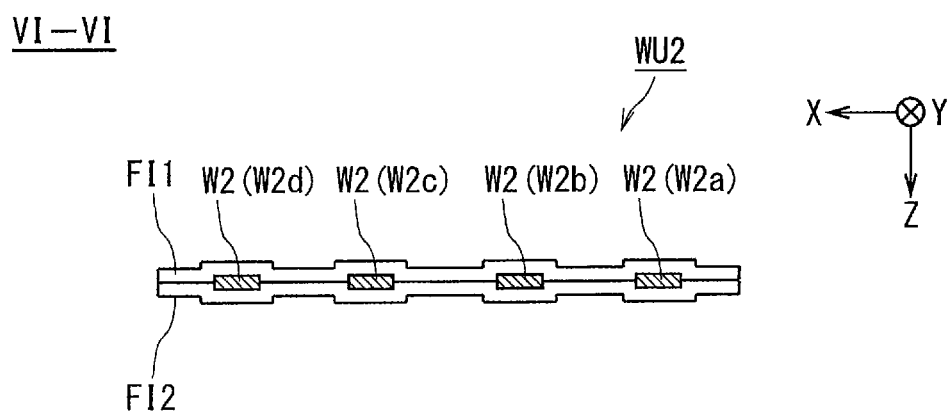
FIG. 6 illustrates a cross-sectional view showing a cross section of the wiring unit along a VI-VI line in FIG. 5.

Herein, for example, as shown in FIG. 4, the first wiring member W1 may include a part (also referred to as a first part) PT1 located between the second sealing member FL2 and the solar cell element CE1. In the example in FIG. 4, the first part PT1 is included in a section Z1 in the first wiring member W1. In this case, for example, when an insulating member IN1 is located between the first part PT1 of the first wiring member W1 and the solar cell element CE1, a short circuit caused by a contact between the electrode of the solar cell element CE1 and the first wiring member W1 hardly occurs. A resin having insulation properties may be adopted as a material of the insulating member IN1, for example. In the example in FIG. 2 to FIG. 4, the insulating member IN1 is located between a part of the first wiring member W1 covered by the second sealing member FL2 and the solar cell element CE1. A shape of the insulating member IN1 may be a sheet-like shape, for example. EVA or polyethylene terephthalate (PET) or a lamination of EVA and PET can be used as a material of the insulating member IN1.

When such a configuration is adopted, as shown in FIG. 4, for example, a thick part where the first part PT1, the insulating member IN1, and the second sealing member FL2 are stacked on each other is easily formed. Thus, for example, a convex part PR1 is easily formed above the first part PT1 in a surface of the second sealing member FL2 on an opposite side of the first part PT1. In this case, when the second protection member PL2 is a plate member made of glass, an acrylic resin or the like having a water shielding property, the second protection member PL2 does not have flexibility, differing from the protection sheet BS1 having the flexibility in the first solar cell module 100 before repaired. Thus, when the second wiring member W2 is located not to stack on the first part PT1 in a perspective plan view of the second protection member PL2, the convex part PR1 can be filled by the third sealing member FL3 even when the third sealing member FL3 is thin. As a result, a gap hardly occurs between the third sealing member FL3 and the flat second protection member PL2, for example. In other words, air is hardly left in a position between the third sealing member FL3 and the flat second protection member PL2, for example. Thus, adhesion between the third sealing member FL3 and the second protection member PL2 is improved, for example. Accordingly, the second protection member PL2 is hardly separated. For example, reduced is the increase in the thickness of the third sealing member FL3 for embedding a convex-concave part on the surface of the second sealing member FL2 and the second wiring member W2, and a used amount of the material of the third sealing member FL3 can be reduced. Accordingly, the usable period of the second solar cell module 200 after repaired can be easily prolonged, for example.

The lamination processing is performed in manufacturing the first solar cell module 100 before repaired in some cases, for example. At this time, as shown in FIG. 3 and FIG. 4, the thickness of the second sealing member FL2 tends to decrease with a decreasing distance to an outer periphery of the second sealing member FL2 (that is to say, the outer periphery EG2) in some cases. In such a case, for example, when the thickness of the third sealing member FL3 tends to increase with the decreasing distance to the outer periphery of the third sealing member FL3 (that is to say, the outer periphery EG2), the increase and decrease in the thickness of the second sealing member FL2 may be offset by a distribution of the thickness of the third sealing member FL3. Accordingly, a gap hardly occurs between the third sealing member FL3 and the flat second protection member PL2, for example. In other words, air is hardly left in a position between the third sealing member FL3 and the flat second protection member PL2, for example. As a result, adhesion between the third sealing member FL3 and the second protection member PL2 is improved, for example, and the second protection member PL2 is hardly separated. That is to say, the usable period of the second solar cell module 200 after repaired is prolonged, for example.

For example, as shown in FIG. 2 to FIG. 6, also adoptable is a unit (also referred to as a wiring unit) WU2 in which the plurality of second wiring members W2 are arranged at a preset interval and sandwiched between a first insulating film FI1 and a second insulating film FI2 to be integral with them. A unit having a configuration of a flexible flat cable (FFC) is adopted as the wiring unit WU2, for example. The wiring unit WU2 may be formed by performing the lamination processing on a sheet which is to be the first insulating film FI1 by an application of heat, the plurality of second wiring members W2, and a sheet which is to be the second insulating film FI2 by an application of heat, for example, stacked in layers. When such a wiring unit WU2 is adopted, for example, a positioning of the plurality of second wiring members W2 with respect to the plurality of first wiring members W1 can be easily performed at a time of connecting the plurality of second wiring members W2 to the plurality of first wiring members W1 passing through the second sealing member FL2 at the preset interval. Accordingly, a positioning operation of the plurality of second wiring members W2 can be easily performed and a repetitive positioning operation hardly occurs. Particularly, when a large number of first solar cell modules 100 of the same model are repaired, the wiring unit WU2 of the same model is used, thus the number of working man-hours can be significantly reduced. Accordingly, the usable period of the second solar cell module 200 after repaired can be easily prolonged, for example.

It is considered that, for example, at the time of repairing the first solar cell module 100, the first terminal box BX1 and the protection sheet BS1 are removed from the first solar cell module 100, and then, the wiring unit WU2, a sheet SE3 which is to be the third sealing member FL3 by an application of heat, and the second protection member PL2 are stacked on the second sealing member FL2, and the lamination processing is performed thereon. However, in the first solar cell module 100 before repaired, for example, the second sealing member FL2 has been already bridged and cured. Thus, in the lamination processing, for example, the second sealing member FL2 is hardly melted, and the wiring unit WU2 is hardly bonded to the second sealing member FL2 tightly.

Thus, as shown in FIG. 2 to FIG. 4, it is also applicable that the wiring unit WU2 is located between the second sealing member FL2 and the third sealing member FL3, and the fourth sealing member FL4 smaller than the second sealing member FL2 is located between the second sealing member FL2 and the wiring unit WU2. EVA, TAC, or a polyester resin such as PEN, for example, is adopted as a material of the fourth sealing member FL4 in the manner similar to the third sealing member FL3. The fourth sealing member FL4 may have translucency with respect to light having the wavelength in the specific range or may not have translucency with respect to light having the wavelength in the specific range in the manner similar to the second sealing member FL2.

Herein, the lamination processing for the repairing is performed in a state where a sheet which is to be the fourth sealing member FL4 is located between the second sealing member FL2 and the wiring unit WU2, for example. Accordingly, air is hardly left in a position between the second sealing member FL2 and the fourth sealing member FL4 and a position between the fourth sealing member FL4 and the wiring unit WU2 (specifically, the second insulating film FI2). As a result, adhesion between the wiring unit WU2 and the second sealing member FL2 can be improved by positioning the fourth sealing member FL4 therebetween, for example. As a result, the usable period of the second solar cell module after repaired can be prolonged, for example.

When the third sealing member FL3 contains a larger amount of acid acceptor than the second sealing member FL2, for example, the durability of the second solar cell module 200 after repaired can be improved. Furthermore, it is applicable in the second solar cell module 200, for example, that the thickness of the second sealing member FL2 tends to decrease and the thickness of the third sealing member FL3 tends to increase with the decreasing distance to the outer periphery EG2. Accordingly, in the outer periphery EG2 of the second solar cell module 200 where moisture is easily absorbed, a proportion (rate) of the third sealing member FL3 relatively having a larger contained amount of the acid acceptor than the second sealing member FL2 increases. Accordingly, the durability of the second solar cell module 200 can be improved. Herein, when EVA or the like which also contains an acid acceptor is used as the material of the second sealing member FL2 and third sealing member FL3, for example, the acid acceptor in the second sealing member FL2 has already decreased by the use in the first solar cell module 100 before repaired. Thus, when the third sealing member FL3 is formed using a material similar to that in manufacturing the second sealing member FL2, for example, the contained amount of the acid acceptor in the third sealing member FL3 can be relatively larger than that in the second sealing member FL2.

<1-2. Method of Manufacturing Solar Cell Module>

Figure 8:
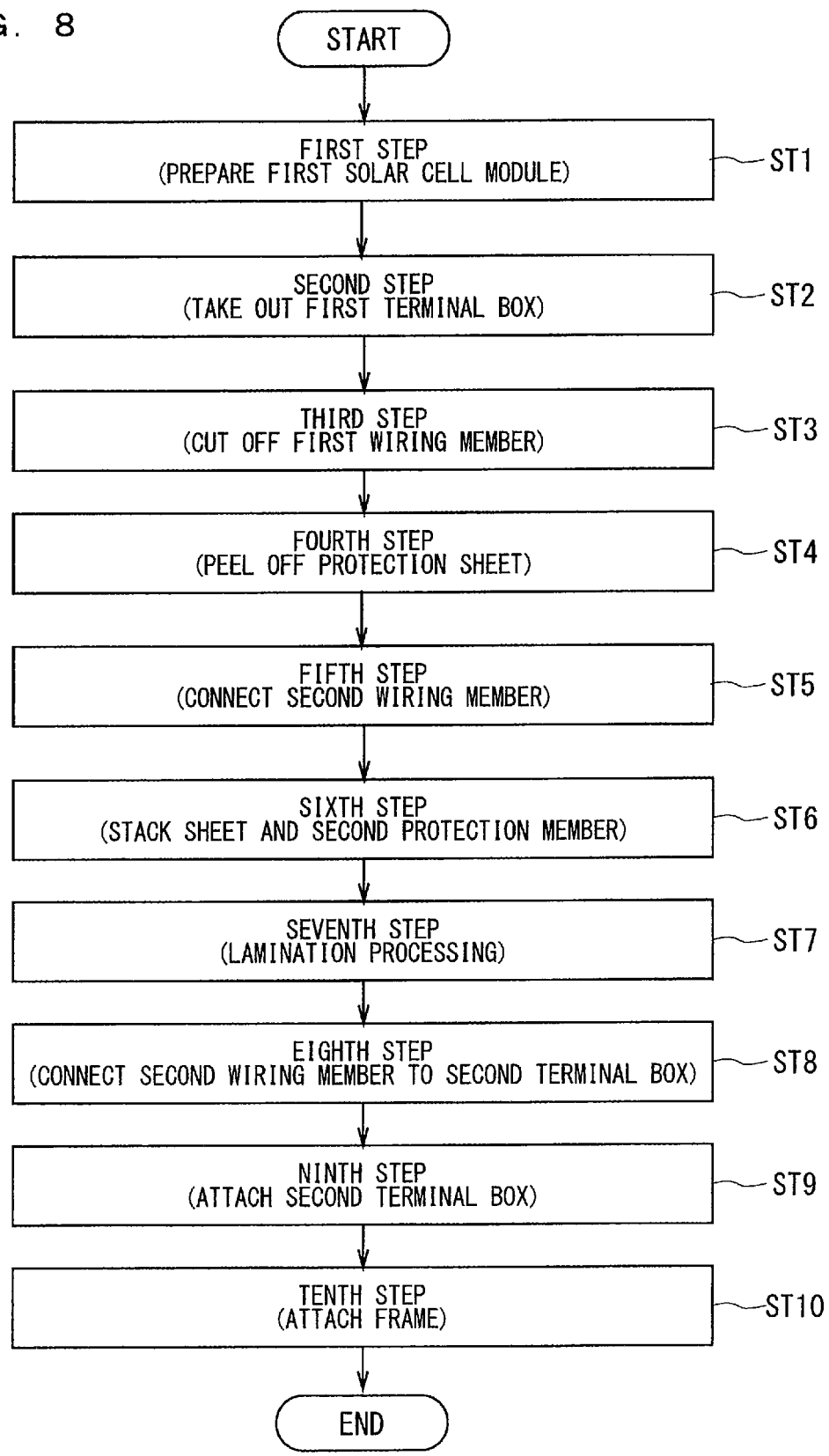
FIG. 8 illustrates a flow chart showing one example of a flow of manufacturing the solar cell module.

One example of a method of manufacturing the second solar cell module 200 after repaired from the first solar cell module 100 before repaired will be described with reference to FIG. 7 to FIG. 11. Herein, a first step ST1 to a tenth step ST10 shown in FIG. 8 are performed in this order, thus the first solar cell module 100 can be repaired to manufacture the second solar cell module 200.

Firstly, in the first step ST1, the first solar cell module 100 before repaired is prepared, for example. Herein, as shown in FIG. 7, for example, the first solar cell module 100 comprises a solar cell panel (also referred to as a first solar cell panel) PN1 which includes the first protection member PL1, the first sealing member FL1, the N solar cell elements CE1, the second sealing member FL2, the protection sheet BS1, the plurality of first wiring members W1, and the first terminal box BX1. Herein, the first protection member PL1 is the plate-like member having the translucency, for example, as described above. The protection sheet BS1 is a sheet with water resistance made up of one or two types of resins of polypropylene and polyolefin or the like, for example. The N solar cell elements CE1 are located between the first protection member PL1 and the protection sheet BS1, for example. For example, the N solar cell elements CE1 are located between the first protection member PL1 and the protection sheet BS1 facing with each other. The first sealing member FL1 is located to cover the N solar cell elements CE1 from the side of the first protection member PL1 between the first protection member PL1 and the N solar cell elements CE1, for example, as described above. The second sealing member FL2 is located to cover the N solar cell elements CE1 from the side of the protection sheet BS1 between the N solar cell elements CE1 and the protection sheet BS1, for example. The plurality of first wiring members W1 are located to be electrically connected to the N solar cell elements CE1 and pass through the second sealing member FL2 and the protection sheet BS1, for example. The first terminal box BX1 is located on the protection sheet BS1 and includes a terminal to which the plurality of first wiring members W1 are connected. The first terminal box BX1 can output electricity obtained by a power generation in the N solar cell elements CE1 to an outside of the first solar cell module 100 via a cable (not shown), for example.

Herein, when a frame (also referred to as a first frame) FM1 is attached to an outer periphery of the first solar cell panel PN1 in the first solar cell module 100, for example, the first frame FM1 is taken out from the first solar cell module 100. The first frame FM1 is located to be fixed to the outer periphery of the first solar cell panel PN1 by a butyl rubber gluing agent, for example. The gluing agent is softened by heating the first frame FM1, and the first frame FM1 is provided with a power of being separated from the first solar cell panel PN1. At this time, the first frame FM1 is provided with a power so that the first frame FM1 is rotated around a part of the first frame FM1 to which the first solar cell panel PN1 is attached. Herein, the first frame FM1 may be provided with a power of being separated from the first solar cell panel PN1 from a first end of the first frame FM1 in a longitudinal direction to a second end thereof located on an opposite side of the first end in sequence, for example. In other words, the first frame FM1 may be provided with the power by which the first frame FM1 is rotated. Accordingly, the first frame FM1 can be taken out from the first solar cell module 100, for example.

Considered herein, for example, is a reuse of the first frame FM1 as the second frame FM2 of the second solar cell module 200. In this case, for example, when the first frame FM1 is taken out from the first solar cell module 100, a batten may come in direct contact with a surface (also referred to as an outer periphery surface) of the first frame FM1 located on an opposite side of the first solar cell panel PN1. Adopted as the batten is a rod-like member having a higher intensity than the first frame FM1, for example. Accordingly, a distortion hardly occurs in the first frame FM1 at the time of taking out the first frame FM1 from the first solar cell module 100, for example. A material of the batten is not limited to wood, but may be made up of various types of materials such as a metal with a surface covered by a resin, for example. For example, if the batten is provided with an electric wire heater, the first frame FM1 can be easily heated.

Figure 10:
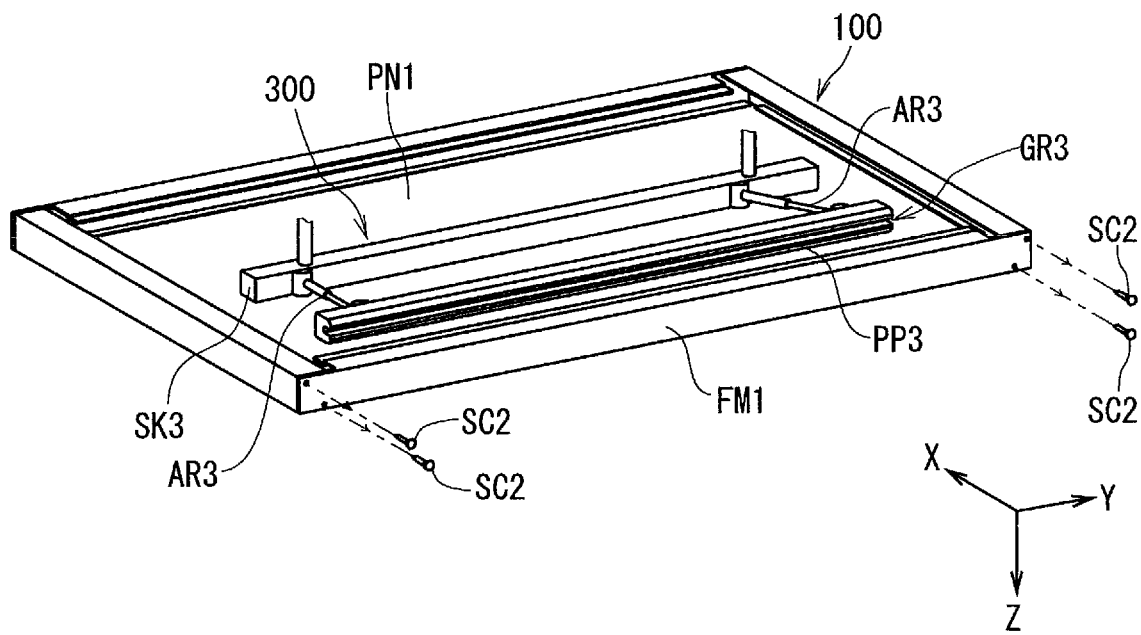
FIG. 10 illustrates a perspective view showing one example of a state of taking out a frame from the solar cell module before repaired.
Figure 11:
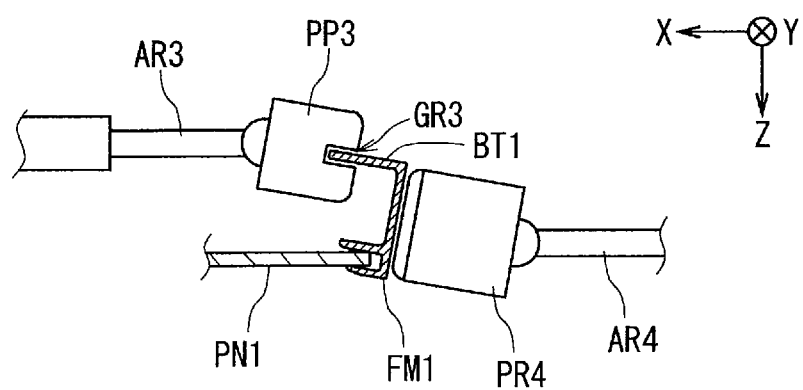
FIG. 11 illustrates a cross-sectional view showing one example of a state of taking out the frame from the solar cell module before repaired.

Firstly, a fixation member SC2 such as a screw fixing the first frame FM1 is taken out as shown in FIG. 10, for example. Next, a batten PR4 rotatably supported around an arm AR4 is pressed on the outer periphery surface of the first frame FM1 as shown in FIG. 11, for example. At this time, the heating of the first frame FM1 is started using an electric wire heater, for example. Subsequently, as shown in FIG. 10 and FIG. 11, for example, a bottom part BT1 of the first frame FM1 farther away from a part to which the first solar cell panel PN1 is attached is pressed by a pressure device 300. Accordingly, the first frame FM1 can be taken out from the first solar cell module 100.

The pressure device 300 comprises a base part SK3, two arms AR3, and a pressing part PP3 as shown in FIG. 10. The base part SK3 is a part constituting a base of the pressure device 300. The two arms AR3 are located to be rotatably attached to parts of the base part SK3 separated from each other. Each of the two arms AR3 has a structure extendable by an air cylinder or the like. The two arms AR3 are located to be attached to parts of the pressing part PP3 separated from each other. Specifically, the pressing part PP3 is located to be rotatably attached to an end of each of the two arms AR3 on an opposite side of an end attached to the base part SK3. The pressing part PP3 is a rod-like member having a groove GR3 in which a tip of the bottom part BT1 of the first frame FM1 is fitted. The two arms AR3 are appropriately elongated and contracted using the pressure device 300 having such a structure, thereby providing the first frame FM1 with the power of rotating the first frame FM1, for example. Accordingly, the first frame FM1 can be taken out from the first solar cell panel PN1.

Figure 9A:
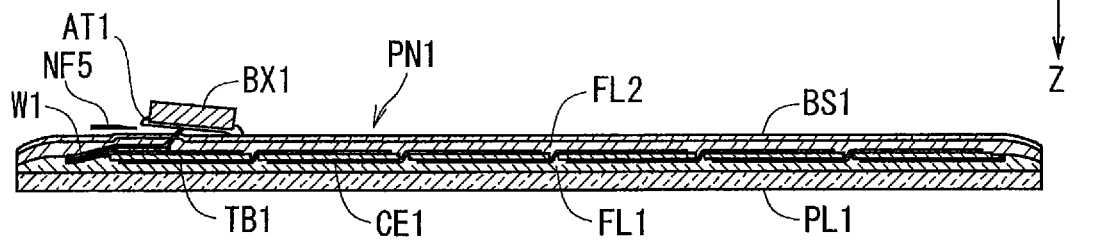
FIGS. 9A to 9E illustrate cross-sectional views each exemplifying a state of halfway manufacturing the solar cell module.

Next, in the second step ST2, the first terminal box BX1 is taken out from the protection sheet BS1 as shown in FIG. 9A, for example. In the first solar cell panel PN1, the first terminal box BX1 is located to be fixed to the protection sheet BS1 by an adhesive agent AT1 such as silicone, for example. In this case, for example, if almost the whole bottom surface of the first terminal box BX1 is fixed to the protection sheet BS1 by the adhesive agent AT1, for example, it is hard to take out the first terminal box BX1 from the protection sheet BS1 only by providing a pull force. Thus, a cutting jig NF5 is inserted along the protection sheet BS1 between the first terminal box BX1 and the protection sheet BS1, thereby cutting off the adhesive agent AT1. Adoptable herein as the cutting jig NF5 is, for example, a hot knife with a cutting blade heatable by a heater, an ultrasonic cutter with a cutting blade which can be ultrasonically vibrated, a saw teeth with a thin blade, or a cutting jig with a cutting blade which is heatable and can be ultrasonically vibrated. When the adhesive agent AT1 is cut off by these cutting jigs, the adhesive agent AT1 is cut off other than a part surrounding the first wiring member W1 whose position is previously recognized, for example. Subsequently, the part of the adhesive agent AT1 around the first wiring member W1 is melted and cut off by a hot cutter having a heated blade. The blade of the hot cutter is heated by conducting electricity in an electrically-heated wire such as a nichrome wire or a piano wire, for example. At this time, when a power of moving the blade of the hot cutter is small, for example, the first wiring member W1 is not cut off by the blade. Thus, the adhesive agent AT1 around the first wiring member W1 can be cut off with little damage on the first wiring member W1. In this manner, the first terminal box BX1 is taken out from the protection sheet BS1.

Next, in the third step ST3, a part of the plurality of first wiring members W1 ranging from the protection sheet BS1 to the terminal in the first terminal box BX1 is cut off, for example. Herein, a pull force is added to the first terminal box BX1 which has been taken out from the protection sheet BS1 in the second step ST2 described above in a direction away from the protection sheet BS1, for example. Then, a part of the first wiring member W1, which is located between the protection sheet BS1 and the first terminal box BX1, closer to the first terminal box BX1 is cut off by a nipper or the like, while extending the first wiring member W1 by the pull force, for example. Obtained at this time, for example, is a state where approximately several millimeters to five millimeters of the first wiring member W1 protrudes from the protection sheet BS1.

Figure 9B:
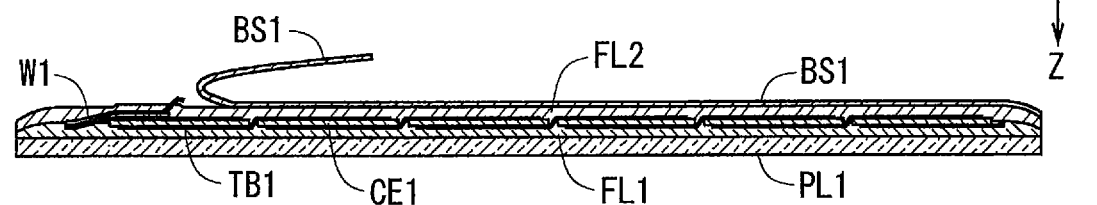

Next, in the fourth step ST4, the protection sheet BS1 is removed from the second sealing member FL2 as shown in FIG. 9B, for example. Accordingly, the state where the part of the first wiring member W1 protrudes from the surface of the second sealing member FL2, for example. Herein, for example, the protection sheet BS1 can be peeled off from the second sealing member FL2 by a mechanical method such as a method of providing the pull force by a hand. At this time, the protection sheet BS1 may be provided with heat by a blowing of hot air, for example. Herein, for example, the part of the protection sheet BS1 tightly bonded to the area around the first wiring member W1 may be removed by cutting, thermal cutting by the application of heat and the like.

Figure 9C:
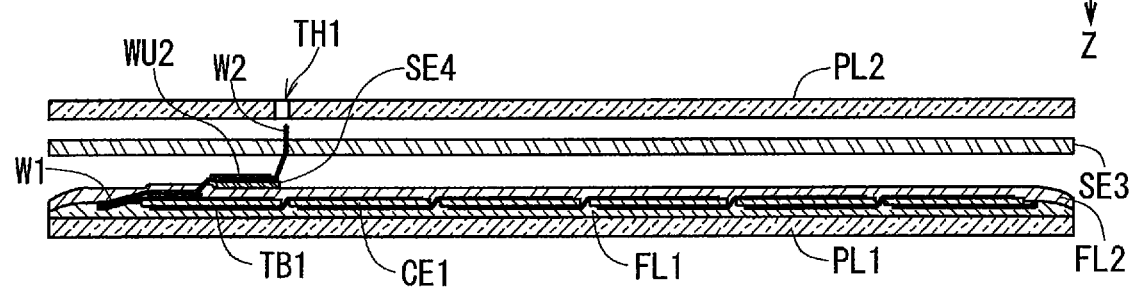

Next, in a fifth step ST5, as shown in FIG. 9C, the plurality of second wiring members W2 are connected to the parts of the plurality of first wiring members W1 protruding from the second sealing member FL2, for example. Herein, the second wiring member W2 can be connected to the first wiring member W1 by a bonding performed by soldering or the like, for example. For example, it is possible to apply a flux to a part of the first wiring member W1 and second wiring member W2 bonded to each other and perform the soldering by a soldering iron. For example, the wiring unit WU2 in which the plurality of second wiring members W2 sandwiched between the first insulating film FI1 and the second insulating film FI2 are integrated with each other may be used, for example. In this case, for example, a positioning of the plurality of second wiring members W2 with respect to the plurality of first wiring members W1 can be easily performed at a time of connecting the plurality of second wiring members W2 to the plurality of first wiring members W1 passing through the second sealing member FL2 at the preset interval.

Figure 9D:
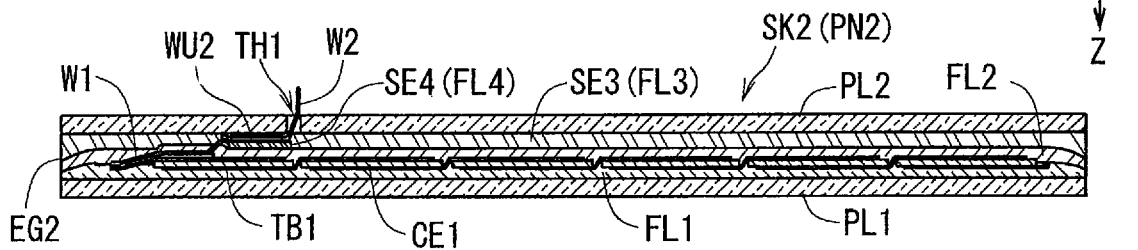

Next, in a sixth step ST6, as shown in FIG. 9C to FIG. 9D, for example, at least the sheet SE3 which is to be the third sealing member FL3 by the application of heat and the second protection member PL2 are located to be stacked on the second sealing member FL2. Herein, for example, the plurality of second wiring members W2 are inserted to pass through a cutting portion or a through hole which is preset in the sheet SE3. Herein, for example, the plurality of second wiring members W2 are inserted to pass through the through hole TH1 or the like which is preset in the second protection member PL2. A lamination body SK2 is thereby formed. In the lamination body SK2, for example, at least the first protection member PL1, the first sealing member FL1, the N solar cell elements CE1, the second sealing member FL2, the sheet SE3, and the second protection member PL2 are stacked.

For example, when the wiring unit WU2 is adopted, it is applicable to place a sheet SE4 which is to be the fourth sealing member FL4 by the application of heat on the second sealing member FL2 and then place the wiring unit WU2 thereon at the time of placing the wiring unit WU2 on the second sealing member FL2. In this case, for example, it is also applicable to previously bond the seat SE4 to the wiring unit WU2, and then place a lamination body of the sheet SE4 and wiring unit WU2 on the second sealing member FL2. A spot welding using a soldering iron or the like, for example, can be applied as a method of bonding the sheet SE4 to the wiring unit WU2. In this manner, when the wiring unit WU2 and the sheet SE4 are previously integrated with each other, for example, the positioning between the wiring unit WU2 and the sheet SE4 can be easily performed.

Next, in a seventh step ST7, the sheet SE3 is heated to enter a flowable state, for example, and the second sealing member FL2, the third sealing member FL3 and the second protection member PL2 are integrated with each other. Herein, for example, if there is the sheet SE4, the second sealing member FL2, the fourth sealing member FL4, the third sealing member FL3 and the second protection member PL2 are integrated with each other by an application of heat. Herein, lamination processing using a lamination device (laminator) is performed, for example. For example, in the laminator, the lamination body SK2 is disposed on a heater board in a chamber, and the lamination body SK2 is heated to approximately 100° C. to 200° C. while reducing pressure in the chamber to approximately 50 Pa to 150 Pa. At this time, the sheet SE3 or the sheet SE3 and sheet SE4 enter a flowable state by an application of heat. In this state, the lamination body SK2 is pressed by a diaphragm sheet or the like, in the chamber, and a plurality of parts constituting the lamination body SK2 are integrated with each other.

Next, in an eighth step ST8, for example, the plurality of second wiring members W2 are connected to the second terminal box BX2. At this time, the second wiring member W2 is connected to the terminal in the second terminal box BX2, for example.

Figure 9E:
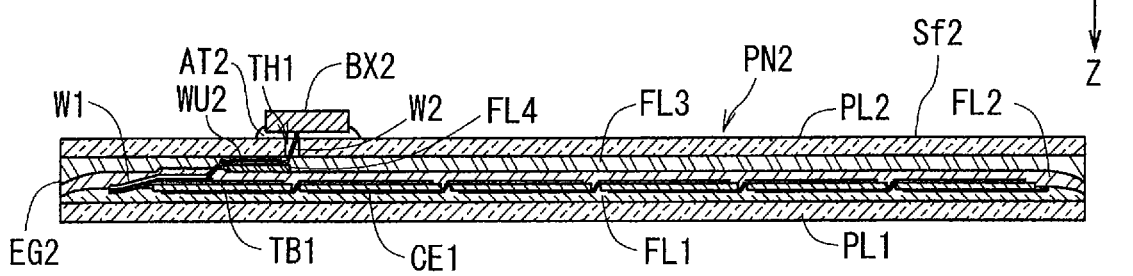

Next, in a ninth step ST9, as shown in FIG. 9E, for example, the second terminal box BX2 is attached to the back surface Sf2 of the second protection member PL2. Herein, the second terminal box BX2 is fixed to the back surface Sf2 by the adhesive agent AT2 such as the silicone-based resin, for example. Accordingly, the second solar cell panel PN2 after repaired is completed.

Next, in a tenth step ST10, the second frame FM2 is attached to the outer periphery EG2 of the second solar cell panel PN2, for example. Herein, for example, the outer periphery EG2 of the second solar cell panel PN2 is inserted into the groove of the second frame FM2 in the state where an adhesive agent such as a butyl-based resin or the like is provided in the groove of the second frame FM2. Accordingly, for example, the outer periphery EG2 of the second solar cell panel PN2 can be fixed to the second frame FM2 by the adhesive agent such as the butyl-based resin or the like in the groove of the second frame FM2.

<1-3. Summary of First Embodiment>

As described above, in the second solar cell module 200 according to the first embodiment, for example, the plurality of second wiring members W2 are located to be connected to the plurality of first wiring members W1 connected to the N solar cell elements CE1. The second solar cell module 200 includes the second sealing member FL2 covering the N solar cell elements CE1 from the side of the second protection member PL2 and the third sealing member FL3 further covering the second sealing member FL2 from the side of the second protection member PL2. When the above configuration is applied, the second solar cell module 200 after repaired can be easily manufactured from the first solar cell module 100 before repaired by the method of manufacturing the second solar cell module 200 according to the first embodiment described above, for example.

For example, the first wiring member W1 is cut off in the position between the first terminal box BX1 and the protection sheet BS1 at the time of taking out the first terminal box BX1 from the first solar cell module 100 before repaired. Next, the protection sheet BS1 is peeled off in the first solar cell module 100, and the second wiring member W2 is additionally connected to the first wiring member W1, for example. Next, the sheet SE3 which is to be the third sealing member FL3 by the application of heat and the second protection member PL2 are stacked in layers on the second sealing member FL2, for example. Then, the third sealing member FL3 and the second protection member PL2 are integrated with the second sealing member FL2 by the lamination processing or the like, for example. Accordingly, the second wiring member W2 can be easily drawn into the second terminal box BX2 which is newly attached to the side of the back surface Sf2 of the second solar cell module 200 after repaired, for example. According to the steps described above, for example, the number of working man-hours of digging out the first wiring member W1 from the filling material in the first terminal box BX1 can be reduced. As a result, the usable period of the second solar cell module 200 can be easily prolonged.

2. Another Embodiment

The present disclosure is not limited to the first embodiment described above, but can be variously varied or modified without departing from the scope of the present disclosure.

2-1. Second Embodiment

In the first embodiment described above, as shown in FIG. 12, for example, the second solar cell module 200 described above may be changed to a second solar cell module 200A in which the plurality of second wiring members W2 are located to be drawn out of a second solar cell panel PN2A from the outer periphery EG2 based on the second solar cell module 200 as a basic configuration. Applied in this case is a configuration that, for example, the plurality of second wiring members W2 are located to be connected to the plurality of first wiring members W1 between the second sealing member FL2 and the third sealing member FL3, and drawn outside from a position between the second sealing member FL2 and the third sealing member FL3.

Figure 12:
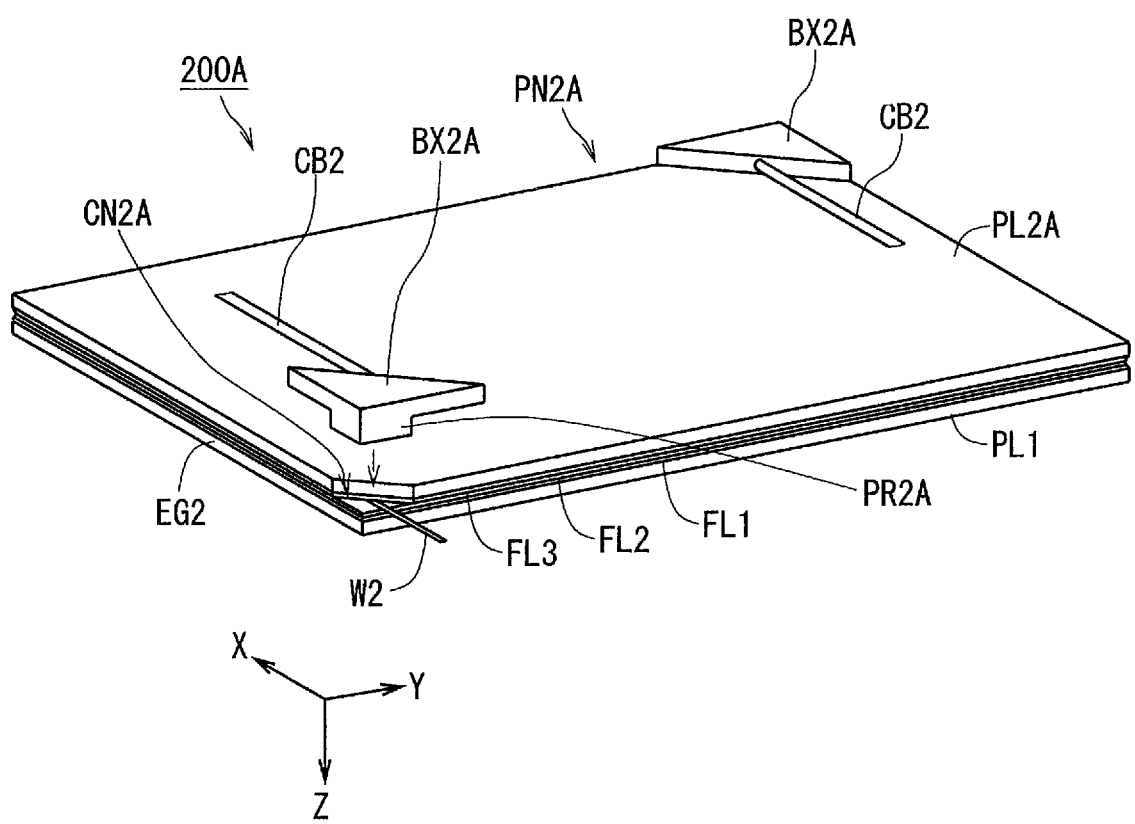
FIG. 12 illustrates a perspective view showing one example of an external appearance of a solar cell module according to a second embodiment.
Figure 13:
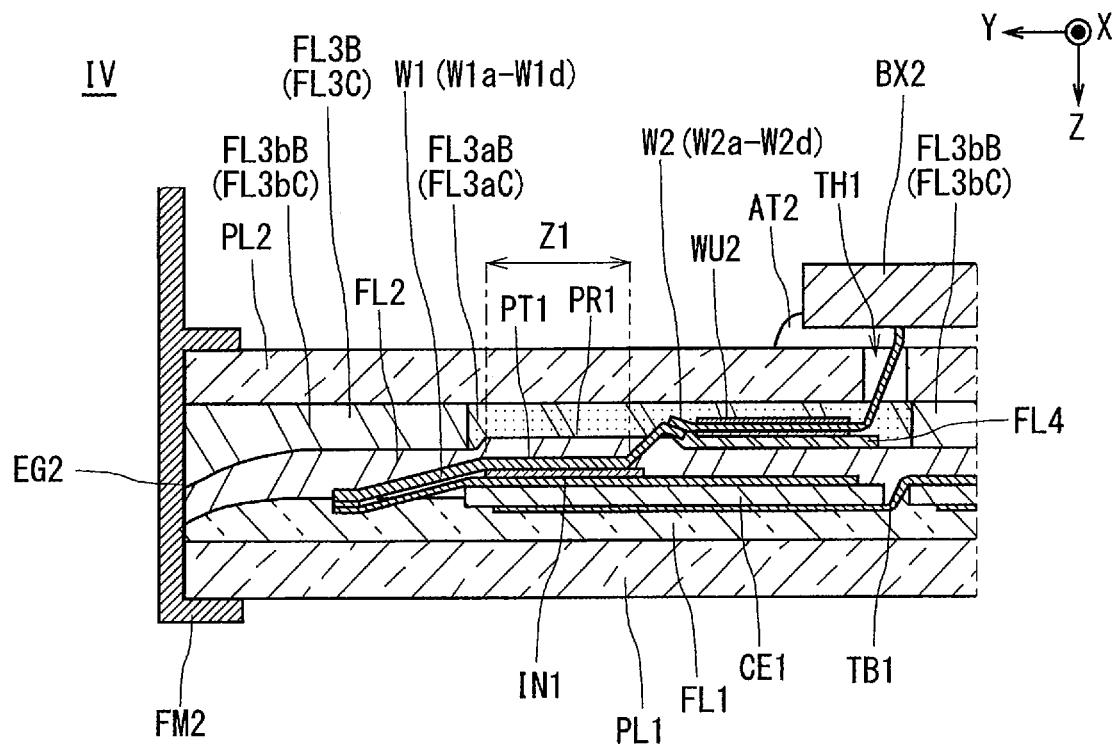
FIG. 13 illustrates a drawing showing a part of a virtual cut section, in a solar cell module according to a third embodiment and fourth embodiment, corresponding to a part of a virtual cut section of the solar cell module shown in FIG. 4.
Figure 14A:
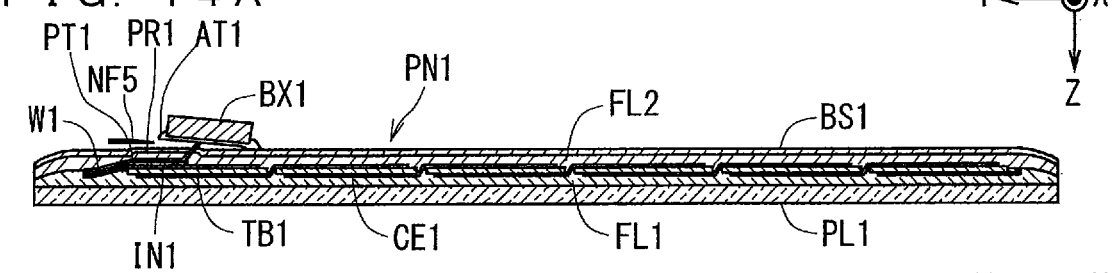
FIGS. 14A to 14E illustrate cross-sectional views exemplifying a state of halfway manufacturing the solar cell module according to the third embodiment.
Figure 14B:
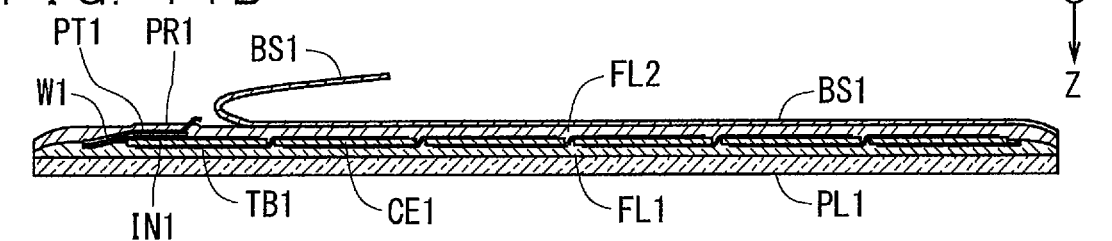
Figure 14C:
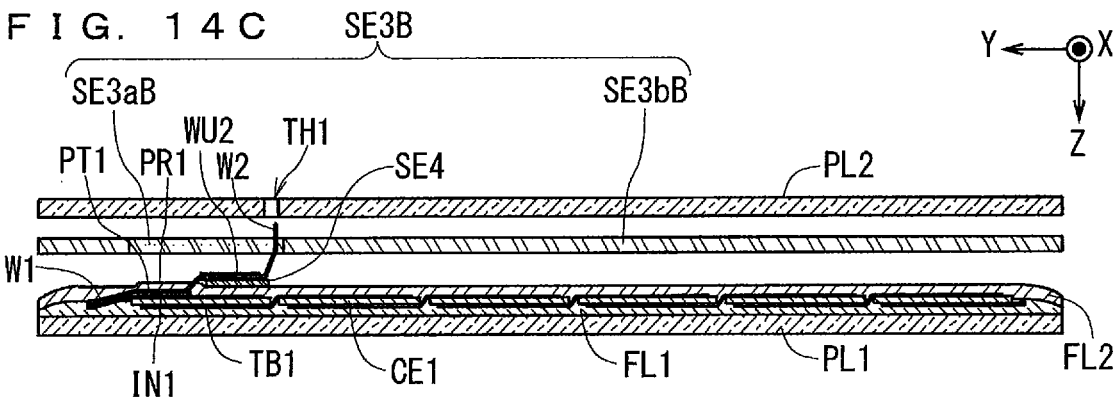
Figure 14D:
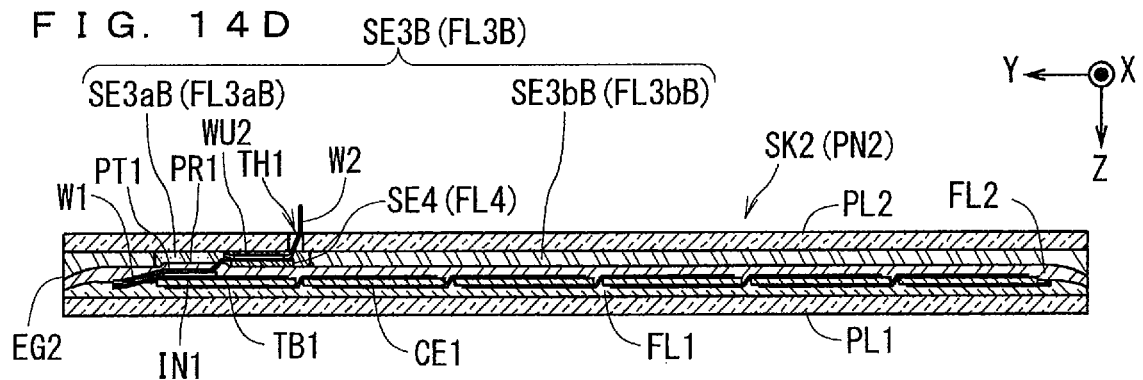
Figure 14E:
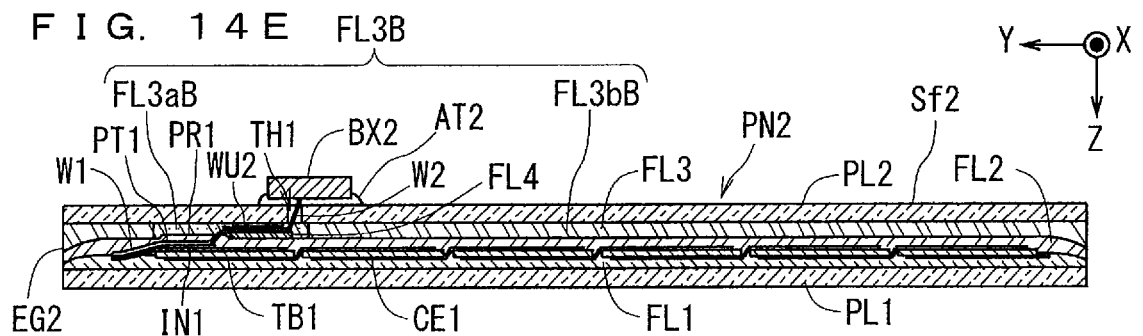
Figure 15A:
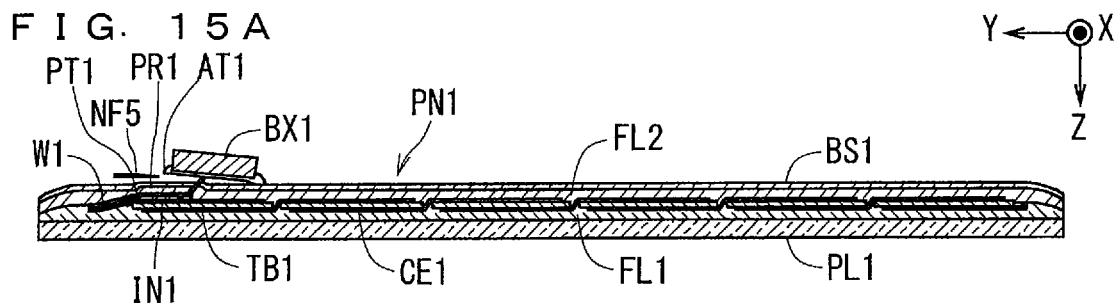
FIGS. 15A to 15E illustrate cross-sectional views exemplifying a state of halfway manufacturing the solar cell module according to the fourth embodiment.
Figure 15B:
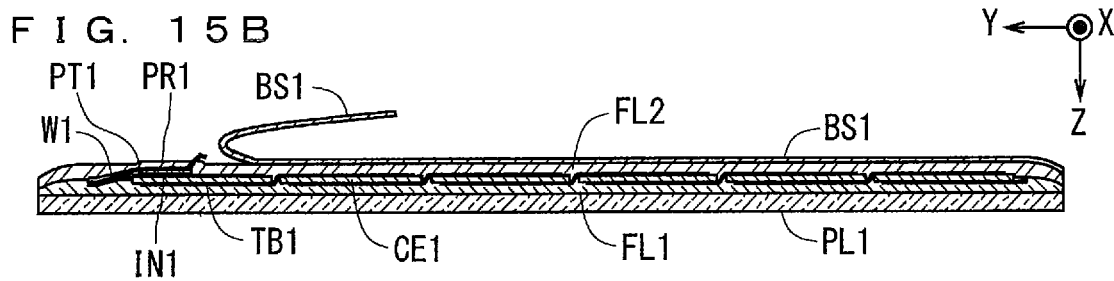
Figure 15C:
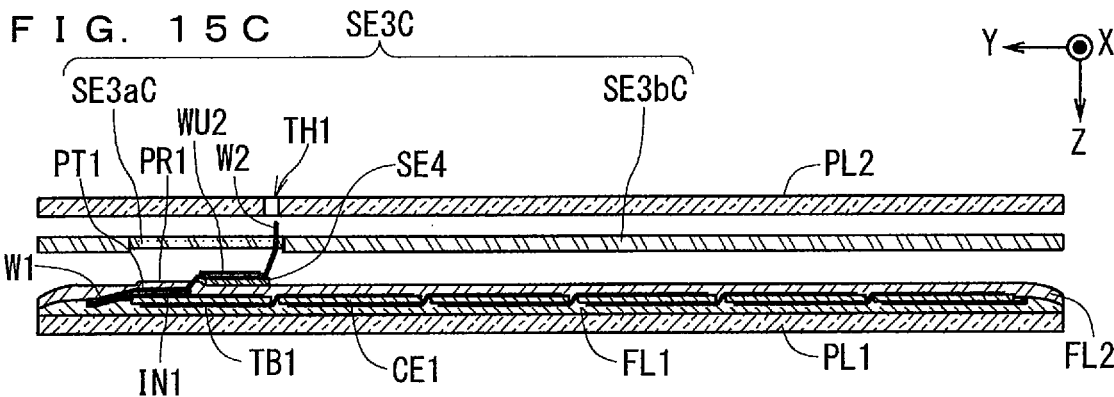
Figure 15D:
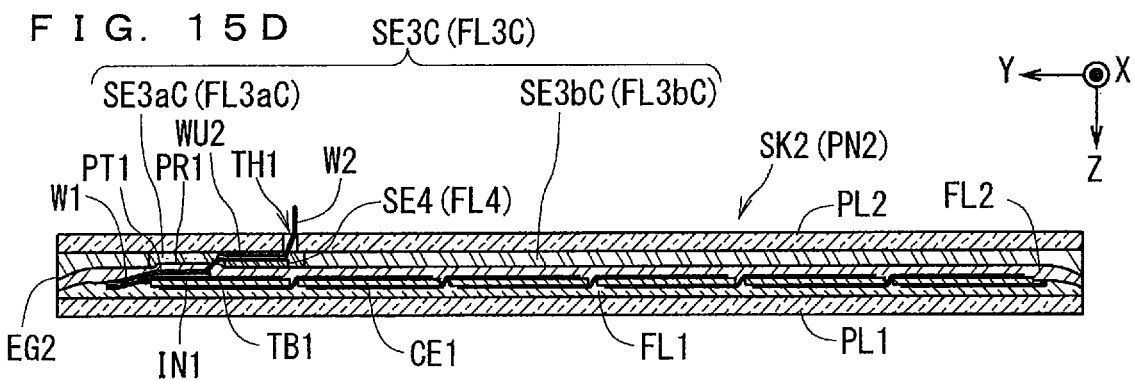
Figure 15E:
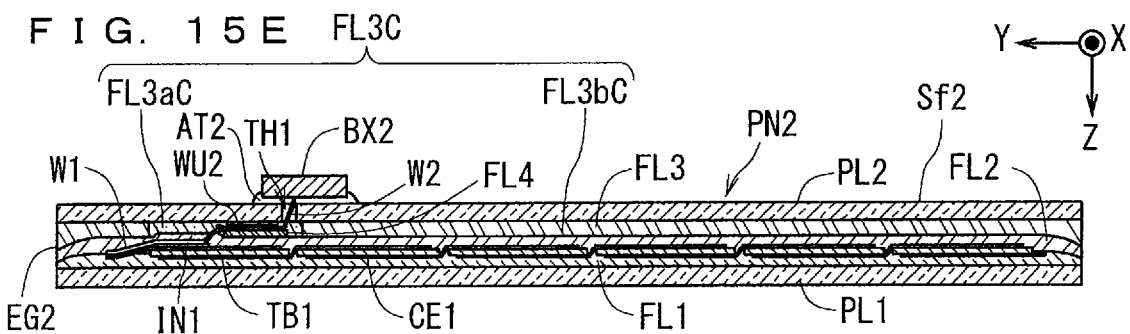

In the example in FIG. 12, the solar cell panel PN2A includes a second protection member PL2A including a notched part CN2A on a corner instead of the second protection member PL2 described above with the solar cell panel PN2 as a basic configuration. Furthermore, in the notched part CN2A in the second protection member PL2A, the second wiring member W2 is located to be drawn outside from a position between the second sealing member FL2 and the third sealing member FL3. A second terminal box BX2A fitted to a difference in level in the notched part CN2A in the second protection member PL2A is adopted instead of the second terminal box BX2 described above. When such a configuration is adopted, a positioning of the second wiring member W2 with respect to the through hole TH1 in the second protection member PL2A needs not be performed, thus the plurality of second wiring members W2 can be easily provided. That is to say, the usable period of the second solar cell module 200 can be easily prolonged, for example.

Herein, for example, two new second terminal boxes BX2A in the second solar cell module 200A are located in a position on the side of the back surface Sf2, which is totally different from that of the first terminal box BX1 in the original first solar cell module 100. In this regard, the second wiring member W2 is additionally connected to the first wiring member W1, thereby being able to easily achieve the wiring member having a required length.

The plurality of second wiring members W2 may be located to be connected to the plurality of first wiring members W1 in the third sealing member FL3 or between the third sealing member FL3 and the second sealing member FL2, for example. It may be applicable in this case, for example, that in the outer periphery EG2, the plurality of second wiring members W2 are drawn outside from the position between the third sealing member FL3 and the second sealing member FL2.

2-2. Third Embodiment

In each embodiment described above, as shown in FIG. 13, for example, the third sealing member FL3 described above may be changed to a third sealing member FL3B having the similar configuration to the third sealing member FL3. Herein, the third sealing member FL3B comprises a third-A sealing member FL3aB and a third-B sealing member FL3bB, for example. The third-A sealing member FL3aB is located to cover the convex part PR1 in the second sealing member FL2 and parts of the plurality of second wiring members W2 located between the second sealing member FL2 and the second protection member PL2. The third-B sealing member FL3bB is located to cover the second sealing member FL2 from a side of the second protection member PL2 around the third-A sealing member FL3aB. The third-A sealing member FL3aB is formed by lamination processing using a third-A sheet SE3aB. The third-B sealing member FL3aB is formed by lamination processing using a third-B sheet SE3bB. The third-B sheet SE3bB has a smaller melt flow rate (also referred to as MFR) than the third-A sheet SE3aB. When such a configuration is adopted, flowability of the third-A sheet SE3aB which is to be the third-A sealing member FL3aB can get higher than that of the third-B sheet SE3bB which is to be the third-B sealing member FL3bB at the time of the lamination processing. Thus, a material of the third-A sheet SE3aB easily extends to a wider range than a material of the third-B sheet SE3bB at the time of the lamination processing, for example. Accordingly, a protruding part protruding in the −Z direction toward the second protection member PL2 in the third sealing member FL3B hardly occurs regardless of the presence of the convex part PR1 and the plurality of second wiring members W2 and the like.

Herein, when the second protection member PL2 is a plate member made of glass, an acrylic resin or the like having a water shielding property, the second protection member PL2 does not have flexibility, differing from the protection sheet BS1 having the flexibility in the first solar cell module 100 before repaired. Even in such a case, when the protruding part hardly occurs on the side of the second protection member PL2 in the third sealing member FL3B, a gap hardly occurs between the third sealing member FL3B and the flat second protection member PL2, for example. Accordingly, air is hardly left between the third sealing member FL3B and the flat second protection member PL2, for example. As a result, adhesion between the third sealing member FL3B and the second protection member PL2 is improved, for example, and the second protection member PL2 is hardly separated from the third sealing member FL3B. For example, reduced is the increase in the thickness of the third sealing member FL3B for embedding the convex-concave part on the surface of the second sealing member FL2 and the second wiring member W2, and a used amount of the material of the third sealing member FL3B can be reduced. Accordingly, the usable period of the second solar cell module 200 after repaired can be easily prolonged, for example.

When the above configuration is adopted, in the first solar cell module 100 before repaired which is prepared in the first step described above, as shown in FIG. 7, for example, the first wiring member W1 includes the first part PT1, the second sealing member FL2 includes the convex part PR1, and the insulating member IN1 is included. The first part PT1 is a part located between the second sealing member FL2 and one or more the solar cell elements CE1 in the first wiring member W1. The insulating member IN1 is located between the first part PT1 and one or more the solar cell elements CE1. The convex part PR1 is a part of the second sealing member FL2 located on the first part PT1 and protruding to the side of the protection sheet BS1. In the sixth step described above, as shown in FIG. 14C and FIG. 14D, for example, the third-A sheet SE3aB which is to be the third-A sealing member FL3aB is provided on the convex part PR1 of the second sealing member FL2 and the plurality of second wiring members W2. At this time, for example, the third-B sheet SE3bB which is to be the third-B sealing member FL3bB is provided around the third-A sheet SE3aB on the second sealing member FL2. Herein, the third-A sheet SE3aB and the third-B sheet SE3bB may have a configuration of one integral sheet SE3B, or may also have a configuration of two separated sheets SE3B. In other words, in the sixth step, one or more sheets SE3B which are to be the third sealing member FL3B may be provided on the second sealing member FL2. In the sixth step described above, a plate member having a water shielding property as the second protection member PL2 is provided to be stacked on the third-A sheet SE3aB and the third-B sheet SE3bB, for example. Then, in the seventh step described above, the third-A sheet SE3aB and the third-B sheet SE3bB are heated to enter a flowable state, for example, and the second sealing member FL2, the third sealing member FL3B, and the second protection member PL2 are integrated with each other.

2-3. Fourth Embodiment

In each embodiment described above, as shown in FIG. 13, for example, the third sealing member FL3 described above may be changed to a third sealing member FL3C having the similar configuration to the third sealing member FL3. Herein, the third sealing member FL3C comprises a third-A sealing member FL3aC and a third-B sealing member FL3bC, for example. The third-A sealing member FL3aC is located to cover the convex part PR1 in the second sealing member FL2 and parts of the plurality of second wiring members W2 located between the second sealing member FL2 and the second protection member PL2 in the manner similar to the third-A sealing member FL3aB described above. The third-B sealing member FL3bC is located to cover the second sealing member FL2 from the side of the second protection member PL2 around the third-A sealing member FL3aC in the manner similar to the third-B sealing member FL3bB described above. These third-A sealing member FL3aC and third-B sealing member FL3bC are formed by lamination processing using the third-A sheet SE3aC and the third-B sheet SE3bC having a different thickness from each other, for example. Herein, the third-A sheet SE3aC is a sheet which is to be the third-A sealing member FL3aC by an application of heat, for example. The third-B sheet SE3bC is a sheet which is to be the third-B sealing member FL3bC by an application of heat with a thickness larger than that of the third-A sheet SE3aC, for example. In other words, the third-A sheet SE3aC has the thickness smaller than the third-B sheet SE3bC. When such a configuration is adopted, a protruding part protruding in the −Z direction toward the second protection member PL2 in the third sealing member FL3C hardly occurs regardless of the presence of the convex part PR1 and the plurality of second wiring members W2 at the time of the lamination processing, for example.

Herein, when the second protection member PL2 is a plate member made of glass, an acrylic resin or the like having a water shielding property, the second protection member PL2 does not have flexibility, differing from the protection sheet BS1 having the flexibility in the first solar cell module 100 before repaired. Even in such a case, when the protruding part hardly occurs on the side of the second protection member PL2 in the third sealing member FL3C, a gap hardly occurs between the third sealing member FL3C and the flat second protection member PL2, for example. Accordingly, air is hardly left between the third sealing member FL3C and the flat second protection member PL2, for example. As a result, adhesion between the third sealing member FL3C and the second protection member PL2 is improved, for example, and the second protection member PL2 is hardly separated from the third sealing member FL3C. For example, reduced is the increase in the thickness of the third sealing member FL3C for embedding the convex-concave part on the surface of the second sealing member FL2 and the second wiring member W2, and a used amount of the material of the third sealing member FL3C can be reduced.

Accordingly, the usable period of the second solar cell module 200 after repaired can be easily prolonged, for example.

When the above configuration is adopted, in the first solar cell module 100 before repaired which is prepared in the first step described above, as shown in FIG. 7, for example, the first wiring member W1 includes the first part PT1, the second sealing member FL2 includes the convex part PR1, and the insulating member IN1 is included. In the sixth step described above, as shown in FIG. 15C and FIG. 15D, for example, the third-A sheet SE3aC which is to be the third-A sealing member FL3aC is provided on the convex part PR1 of the second sealing member FL2 and the plurality of second wiring members W2. At this time, for example, the third-B sheet SE3bC which is to be the third-B sealing member FL3bC is provided around the third-A sheet SE3aC on the second sealing member FL2. The third-B sheet SE3bC has a thickness smaller than the third-A sheet SE3aC. Herein, the third-A sheet SE3aC and the third-B sheet SE3bC may have a configuration of one integral sheet SE3C, or may also have a configuration of two separated sheets SE3C. In other words, in the sixth step, one or more sheets SE3C which are to be the third sealing member FL3C may be provided on the second sealing member FL2. In the sixth step described above, a plate member having a water shielding property as the second protection member PL2 is provided to be stacked on the third-A sheet SE3aC and the third-B sheet SE3bC, for example. Then, in the seventh step described above, the third-A sheet SE3aC and the third-B sheet SE3bC are heated to enter a flowable state, for example, and the second sealing member FL2, the third sealing member FL3C, and the second protection member PL2 are integrated with each other.

3. Other

In the first embodiment and the second embodiment described above, for example, each of the second protection members PL2 and PL2A may be a sheet member having a certain level of flexibility such as the protection sheet BS1 of the first solar cell module 100.

In each embodiment described above, for example, the first solar cell module 100 may not include the first frame FM1. In this case, for example, the step of taking out the first frame FM1 is unnecessary at the time of repairing the first solar cell module 100 to manufacture the second solar cell modules 200 and 200A.

In each embodiment described above, for example, the second solar cell module 200 may not include the second frame FM2. In this case, for example, the step of attaching the second frame FM2 to the second solar cell panel PN2 is unnecessary. In this case, for example, the second solar cell panel PN2 may serve as the second solar cell module 200.

It is obvious that all or some of each embodiment and each modification example described above are appropriately applicable in combination as long as they are not mutually inconsistent.

The invention claimed is:

1. A solar cell module, comprising:
a plate-like first protection member having translucency;
a second protection member;
at least one solar cell element located between the first protection member and the second protection member;
a first sealing member located to cover the at least one solar cell element from a side of the first protection member between the first protection member and the at least one solar cell element;
a second sealing member located to cover the at least one solar cell element from a side of the second protection member between the at least one solar cell element and the second protection member;
a third sealing member located to cover the second sealing member from a side of the second protection member between the second sealing member and the second protection member;
a plurality of first wiring members located to be electrically connected to the at least one solar cell element and pass through the second sealing member; and
a plurality of second wiring members located to be connected to the plurality of first wiring members between the second sealing member and the second protection member, wherein
the second sealing member is located so that a thickness of the second sealing member tends to decrease with a decreasing distance to an outer periphery of the second sealing member, and
the third sealing member is located so that a thickness of the third sealing member tends to increase with a decreasing distance to an outer periphery of the third sealing member.

2. The solar cell module according to claim 1, wherein the second protection member includes a plate member having a water shielding property.

3. The solar cell module according to claim 2, comprising an insulating member located between the first wiring member and the at least one solar cell element; wherein
the first wiring member includes a first part located between the second sealing member and the at least one solar cell element,
the insulating member is located between the first part and the at least one solar cell element, and
the second wiring member is located not to stack on the first part in a perspective plan view of the second protection member.

4. The solar cell module according to claim 1, comprising:
a wiring unit located between the second sealing member and the third sealing member in a state where the plurality of second wiring members are arranged at a preset interval and sandwiched between the first insulating film and the second insulating film to be integral with each other, and
a fourth sealing member, which is smaller than the second sealing member, located between the second sealing member and the wiring unit.

5. The solar cell module according to claim 1, wherein the third sealing member contains a larger amount of acid acceptor than the second sealing member.

6. A method of manufacturing a solar cell module, comprising:
a first step of preparing a solar cell module before repaired which comprises: a plate-like first protection member having translucency; a protection sheet; at least one solar cell element located between the first protection member and the protection sheet; a first sealing member located to cover the at least one solar cell element from a side of the first protection member between the first protection member and the at least one solar cell element; a second sealing member located to cover the at least one solar cell element from a side of the protection sheet between the at least one solar cell element and the protection sheet; a plurality of first wiring members located to be electrically connected to the at least one solar cell element and pass through the second sealing member and the protection sheet and;

and a terminal box located on the protection sheet and including a terminal to which the plurality of first wiring members are connected;

a second step of taking out the terminal box from the protection sheet;

a third step of cutting off a part of the plurality of first wiring members ranging from the protection sheet to the terminal;

a fourth step of peeling off the protection sheet from the second sealing member;

a fifth step of connecting a plurality of second wiring members to parts of the plurality of first wiring members protruding from the second sealing member respectively;

a sixth step of placing at least one sheet which is to be a third sealing member and a second protection member to be stacked on the second sealing member; and a seventh step of heating the at least one sheet to integrate the second sealing member, the third sealing member, and the second protection member.

7. The method of manufacturing the solar cell module according to claim 6, wherein in the first step, the first wiring member includes a first part located between the second sealing member and the at least one solar cell element, the solar cell module before repaired includes an insulating member located between the first part and the at least one solar cell element, and the second sealing member includes a convex part located on the first part and protruding to a side of the protection sheet, and in the sixth step, a 3A sheet included in the at least one sheet is disposed on the convex part and the plurality of second wiring members, a 3B sheet included in the at least one sheet and having a smaller melt flow rate than the 3A sheet is disposed around the 3A sheet on the second sealing member, and a plate member having a water shielding property as the second protection member is disposed on the 3A sheet and the 3B sheet.

8. The method of manufacturing the solar cell module according to claim 6, wherein in the first step, the first wiring member includes a first part located between the second sealing member and the at least one solar cell element, the solar cell module before repaired includes an insulating member located between the first part and the at least one solar cell element, and the second sealing member includes a convex part located on the first part and protruding to a side of the protection sheet, and in the sixth step, a 3A sheet included in the at least one sheet is disposed on the convex part and the plurality of second wiring members, a 3B sheet included in the at least one sheet and having a larger thickness than the 3A sheet is disposed around the 3A sheet on the second sealing member, and a plate member having a water shielding property as the second protection member is disposed on the 3A sheet and the 3B sheet.

9. A solar cell module, comprising:

a plate-like first protection member having translucency;

a second protection member;

at least one solar cell element located between the first protection member and the second protection member;

a first sealing member located to cover the at least one solar cell element from a side of the first protection member between the first protection member and the at least one solar cell element;

a second sealing member located to cover the at least one solar cell element from a side of the second protection member between the at least one solar cell element and the second protection member;

a third sealing member located to cover the second sealing member from a side of the second protection member between the second sealing member and the second protection member;

a plurality of first wiring members located to be electrically connected to the at least one solar cell element and pass through the second sealing member;

a plurality of second wiring members located to be connected to the plurality of first wiring members between the second sealing member and the second protection member;

a wiring unit located between the second sealing member and the third sealing member in a state where the plurality of second wiring members are arranged at a preset interval and sandwiched between the first insulating film and the second insulating film to be integral with each other, and a fourth sealing member, which is smaller than the second sealing member, located between the second sealing member and the wiring unit.

* * * * *